(12) United States Patent
Murayama et al.

(10) Patent No.: US 7,468,639 B2
(45) Date of Patent: Dec. 23, 2008

(54) MODULATION CIRCUIT, DRIVING CIRCUIT AND OUTPUT METHOD

(75) Inventors: Kazuhiko Murayama, Atsugi (JP);
Tatsuro Yamazaki, Machida (JP);
Osamu Sagano, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 640 days.

(21) Appl. No.: 11/167,206

(22) Filed: Jun. 28, 2005

(65) Prior Publication Data

US 2006/0001500 A1    Jan. 5, 2006

(30) Foreign Application Priority Data

Jun. 30, 2004  (JP)  ............................. 2004-193936
Jun. 15, 2005  (JP)  ............................. 2005-175119

(51) Int. Cl.
*H03K 7/08* (2006.01)
*G09G 3/36* (2006.01)

(52) U.S. Cl. .................. 332/109; 315/169.3; 345/89; 345/97

(58) Field of Classification Search .................. 332/109
See application file for complete search history.

(56) References Cited

U.S. PATENT DOCUMENTS

| | | | | |
|---|---|---|---|---|
| 4,427,978 A | * | 1/1984 | Williams ..................... | 345/89 |
| 4,775,891 A | * | 10/1988 | Aoki et al. .................. | 348/572 |
| 5,010,327 A | * | 4/1991 | Wakita et al. ................ | 345/89 |
| 5,010,328 A | * | 4/1991 | Morris et al. ................ | 345/97 |
| 5,331,345 A | | 7/1994 | Akimoto et al. ............. | 348/297 |
| 6,078,751 A | | 6/2000 | Yamazaki et al. ............. | 396/55 |
| 6,215,466 B1 | * | 4/2001 | Yamazaki et al. ............. | 345/89 |
| 6,278,842 B1 | | 8/2001 | Yamazaki et al. ............. | 396/55 |
| 6,873,308 B2 | | 3/2005 | Sagano et al. ............... | 345/75.2 |
| 6,924,843 B1 | | 8/2005 | Yamazaki et al. ............ | 348/423.1 |
| 6,947,018 B1 | | 9/2005 | Yamazaki .................... | 345/75.2 |
| 6,995,516 B2 | * | 2/2006 | Aoki et al. .................. | 315/169.3 |
| 7,057,667 B1 | | 6/2006 | Mori et al. ................... | 348/554 |
| 2002/0195966 A1 | | 12/2002 | Aoki et al. ................ | 315/169.3 |
| 2004/0257386 A1 | | 12/2004 | Sagano et al. ............... | 345/690 |
| 2005/0001827 A1 | | 1/2005 | Abe et al. ................... | 345/204 |
| 2005/0030263 A1 | | 2/2005 | Yamazaki .................... | 345/75.1 |
| 2005/0156869 A1 | | 7/2005 | Mori et al. .................. | 345/104 |
| 2005/0168645 A1 | | 8/2005 | Yamazaki .................... | 348/655 |
| 2005/0285849 A1 | | 12/2005 | Yamazaki .................... | 345/211 |
| 2006/0001499 A1 | | 1/2006 | Tatsumi ...................... | 332/103 |
| 2006/0001500 A1 | * | 1/2006 | Murayama et al. .......... | 332/106 |
| 2006/0001910 A1 | | 1/2006 | Ikeda et al. ................. | 358/3.22 |

FOREIGN PATENT DOCUMENTS

CN    1402213 A       3/2003
JP    2003-173159     6/2003
JP    2003-316312     11/2003

* cited by examiner

*Primary Examiner*—Joseph Chang
(74) *Attorney, Agent, or Firm*—Fitzpatrick, Cella, Harper & Scinto

(57) ABSTRACT

A modulation circuit that outputs modulation signals, comprising: a memory circuit that stores waveform data that determines the time width of a portion of a modulation signal, the portion being adjusted to a predetermined amplitude value, the waveform data being stored in such a manner as to output a plurality of modulation signals; and a circuit that generates the modulation signals, based on the waveform data and input gradation data.

21 Claims, 13 Drawing Sheets

MODULATION CIRCUIT, DRIVING CIRCUIT AND OUTPUT METHOD

BACKGROUND OF THE INVENTION

1. Field of the Invention

The present invention relates to a modulation circuit, a driving circuit, and an output method, and, more particularly, to a driving circuit and a driving method for matrix-type driving devices.

2. Description of the Related Art

U.S. Patent Application Laid-Open No. 2002195966 (Japanese Patent Application Laid-Open No. 2003-173159) discloses a modulation method by which pulse width modulation is combined with amplitude modulation. In this document, the structure in which the rising portions and falling portions of a waveform have step-like shapes is disclosed.

Japanese Patent Application Laid-Open No. 2003-316312 discloses a mechanism of designating falling waveforms with "JBit" in a structure that generates waveforms called "V14 waveforms" having step-like portions.

SUMMARY OF THE INVENTION

A structure that can set the waveforms of output signals under particular waveform setting conditions is desired.

The object of the present invention is to provide a structure that can suitably set the waveforms of output signals under predetermined conditions.

A first aspect of the present invention is structured as follows.

That is, there is provided a modulation circuit that outputs modulation signals, comprising: a memory circuit that stores waveform data that determines a time width of a portion of a modulation signal, the portion being adjusted to a predetermined amplitude value, the waveform data being used to output a plurality of modulation signals; and a circuit that generates the modulation signal, based on the waveform data and input gradation data.

The above structure preferably includes a modulation circuit, wherein the waveform data includes data that determines a timing of start of a control operation to perform a transition from other amplitude value to the predetermined amplitude value, and data to determine a timing of start of a control operation to perform a transition from the predetermined amplitude value to other amplitude value.

The above structure preferably includes a modulation circuit, wherein the waveform data includes data that determines the time width of the portion from a timing of start of a control operation to perform a transition from other amplitude value to the predetermined amplitude value, the timing being determined by the gradation data.

The above structure preferably includes a modulation circuit, wherein each of the modulation signals respectively corresponding to a plurality of the gradation data with different values has the portion which is adjusted to the predetermined amplitude value, and wherein the waveform data is referred to in order to determine the time widths of the portions of the modulation signals.

The above structure preferably includes a modulation circuit, wherein the gradation data includes data that determines a timing of start of a control operation to make an amplitude value of any one of portions of the modulation signal fall.

The above structure preferably includes the data that determines the timing of start of a control operation to change the amplitude value of a modulation signal in a controlled state to other amplitude value, the modulation signal having the maximum amplitude value among the possible amplitude values of modulation signals in the controlled state.

The control operation based on waveform data is preferably a control operation that can be commonly performed to generate modulation signals corresponding to gradation data with different values. More specifically, it is preferable to perform a control operation using waveform data for determining the timing of start of a control operation to perform a transition to a certain amplitude value. Here, the timing can be determined without the use of at least part of information contained in the gradation data. It is also preferable to perform a control operation using gradation data for determining the timing of start of a control operation to perform a transition to a certain amplitude value. Here, the timing should be determined by referring to the gradation data. Also, it is preferable to perform a control operation using gradation data for determining whether a portion to be adjusted to a certain amplitude value is to be supplied to a modulation signal.

The above structure preferably includes a modulation circuit, wherein the waveform of the modulation signal has a portion controlled to have a stepped form, and the waveform data includes information that determines the form of the portion controlled to have the stepped form.

One aspect of the present invention also discloses the following structure as a driving circuit equipped with the modulation circuit.

In other words, a driving circuit comprising: the modulation circuit described above; and a data output circuit that converts an input signal into the gradation data, wherein the modulation circuit and the data output circuit are provided on different substrates from each other.

The gradation data to be used in the modulation circuit is preferably divided into the data for setting a amplitude value and the data for setting a time width (particularly, the time width of the portion of the waveform of the modulation signal to be adjusted to the maximum amplitude value). Here, it is preferable to employ a data output circuit that converts input gradation data into gradation data in the format suitable to be used in the modulation circuit. It is also preferable to place the data output circuit and the modulation circuit on different substrates from each other. If data is parallel-transferred to another substrate, the number of wirings required becomes greater. Therefore, it is preferable to perform a parallel-serial conversion between the data output circuit and the modulation circuit, so as to reduce the number of wirings required. In the parallel-serial conversion, the number of parallels before conversion is reduced to a smaller number (including 1).

One aspect of the present invention also discloses the following method as a method of generating modulation signals.

That is, there is provided a method of generating modulation signals, comprising the steps of: storing waveform data in a memory circuit in a modulation circuit, the waveform data being used to generate a plurality of modulation signals; and sequentially generating the modulation signals respectively corresponding to a plurality of gradation data with different values from one another in the modulation circuit, wherein the same waveform data stored in the memory circuit is used to generate the plurality of modulation signals.

The present invention also discloses the following structure as a modulation circuit that outputs modulation signals.

That is, there is provided a modulation circuit that outputs modulation signals, said modulation circuit configured:

to generate a first modulation signal corresponding to first gradation data with a predetermined value so that the first modulation signal has a waveform in which an amplitude value of a portion to be adjusted to the maximum amplitude value in the waveform becomes an amplitude value Vk, which is the lowest value among the amplitude values that the modulation circuit can output, and to generate a second modulation signal corresponding to second gradation data with a value greater than the predetermined value by 1 so that the second modulation signal has a waveform which includes a first portion to be adjusted to the amplitude value Vk and a second portion to be adjusted to an amplitude value Vk+1 (Vk<Vk+1), the second portion being located in a position other than beginning and end of the waveform of the second modulation signal, the first portion having a time width equal to or greater than a time width of the portion to be adjusted to the amplitude value Vk in the waveform of the first modulation signal.

The above structure preferably configured to generate a modulation signal corresponding to a gradation data with a value greater than the value of the second gradation data by N (N>=1) so that the modulation signal has such a waveform that a time width of the second portion to be adjusted to the amplitude value Vk+1 in the waveform of the second modulation signal is increased by N times width of unit time of time width control.

The present invention also discloses the following method as a method of outputting modulation signals.

That is, there is provided a method of outputting modulation signals, comprising the steps of: outputting a first modulation signal corresponding to first gradation data with a predetermined value, the amplitude value of a portion to be adjusted to the maximum amplitude value of the waveforms of the first modulation signal being adjusted to a amplitude value Vk that is the lowest amplitude value among amplitude values that the modulation circuit can output as the amplitude values of modulation signals; and outputting a second modulation signal corresponding to second gradation data with a value greater than the predetermined value by 1, and having a first portion to be adjusted to the amplitude value Vk and a second portion to be adjusted to a amplitude value Vk+1 (Vk<Vk+1), the second portion being located in a position other than the front edge and the rear edge of the waveform of the second modulation signal, the time width of the first portion being equal to or greater than the time width of the portion of the first modulation signal to be adjusted to the amplitude value Vk.

The present invention also discloses the following structure as an image display device.

That is, there is provided an image display device comprising: the modulation circuit; a plurality of scanning wirings; a plurality of modulation wirings to which modulation signals are supplied from the modulation circuit; and a plurality of display elements that are connected in a matrix fashion with the plurality of scanning wirings and the plurality of modulation wirings.

There is also disclosed a television apparatus comprising: the image display device; and a tuner that is capable of selecting television broadcasting signals, wherein image display is performed based on signals output from the tuner.

DESCRIPTION OF THE PREFERRED EMBODIMENTS

Figure 1:
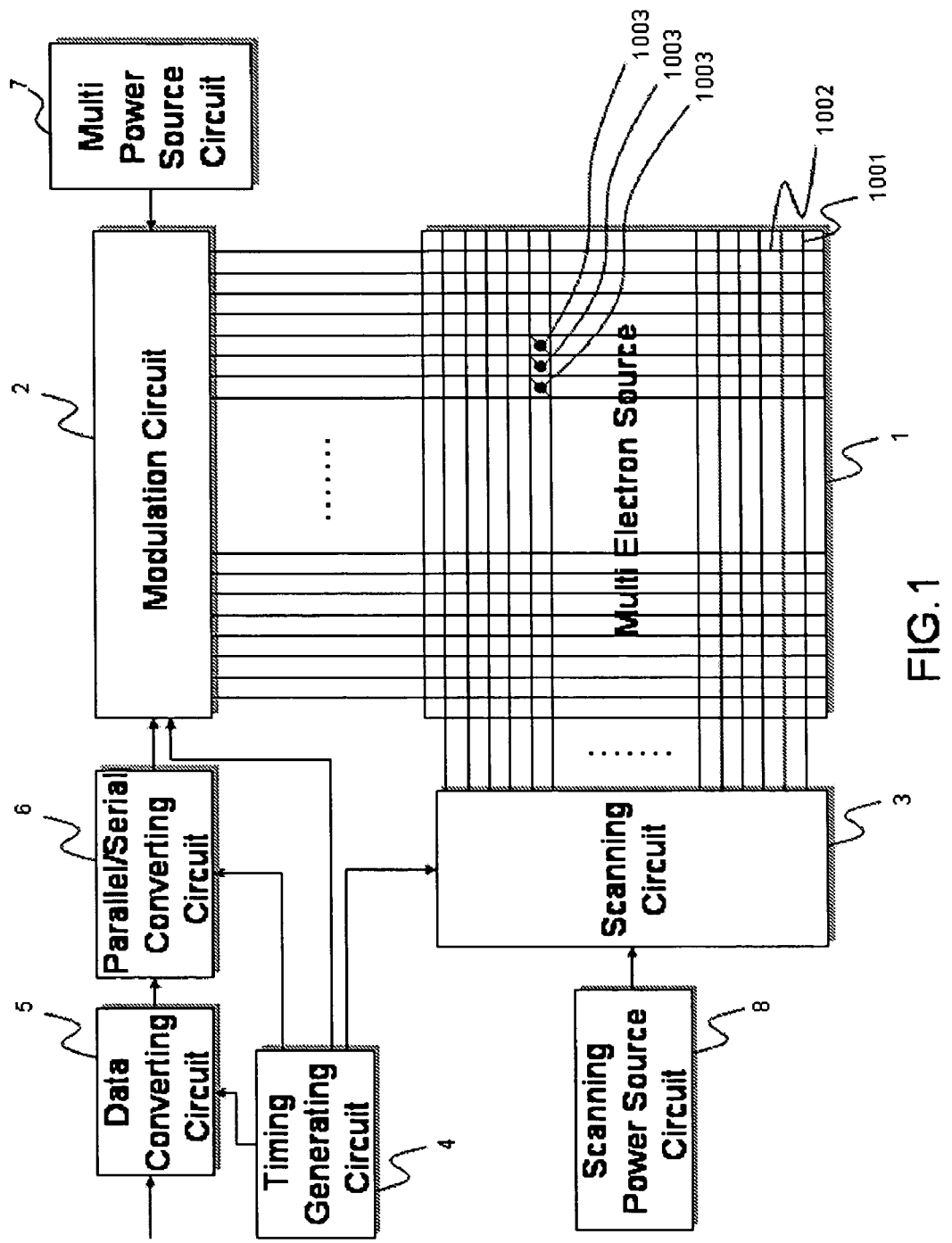
FIG. 1 is a block diagram of a driving circuit according to one embodiment of the present invention.

The following is a description of a driving circuit in accordance with one embodiment of the present invention, with reference to the accompanying drawings. In the drawings showing this embodiment, the same components are denoted by the same reference numerals. FIG. 1 illustrates an image display device in accordance with this embodiment.

The image display device shown in FIG. 1 includes a multi electron source 1 that has display elements 1003, scanning wirings 1001 that connect the display elements 1003 in a matrix fashion, and modulation wirings 1002. In FIG. 1, the display elements 1003, the scanning wirings 1001, and the modulation wirings 1002 are only partially shown so as to avoid an unclear illustration. The display elements 1003 may be of various kinds, such as electron emission elements or EL elements. In this embodiment, surface-conduction emitters that are electron emission elements are employed. A fluorescent body that emits light through electron irradiation is provided to face the electron source 1, and an image is formed through the light emission. Further, the driving circuit that drives the electron source 1 in accordance with this embodiment includes a modulation circuit 2, a scanning circuit 3, a timing generating circuit 4 that constitutes a data output circuit, a data converting circuit 5, a parallel/serial converting circuit 6, a multi power source circuit 7, and a scanning power source circuit 8. This driving circuit constitutes part of the image display unit of the image display device. For example, in a case where the image display unit needs to be divided into a controller and a driving circuit, the data output circuit and the modulation circuit are placed on different substrates from each other.

The modulation circuit 2 is connected to column wirings that are the modulation wirings of the multi electron source 1. The modulation circuit 2 is a circuit that inputs modulation signals to the multi electron source 1 in accordance with modulation data (luminance gradation data). The modulation data that is gradation data is formed by the parallel/serial converting circuit 6 serial-converting PHM data and PWM data. Each one set of gradation data represents the information to be used to generate a modulation signal suitable for a situation in which one display element is continuously selected through a scanning signal that is output by the scanning circuit 3. For example, in a case where the PHM data for setting a amplitude value of modulation signals consists of 2 bits while the PWM data for setting the time width consists of 10 bits, each one set of gradation data is the information consisting of 12 bits. The modulation circuit 2 functions as a modulator that supplies a modulation signal that is modulated based on modulation data input from the parallel/serial converting circuit 6, to the column wirings that are the modulation wirings connected to the electron sources.

The scanning circuit 3 is connected to the row wirings that are the scanning wirings of the multi electron source 1. The scanning circuit 3 is a circuit that applies a scanning signal to each of the scanning wirings. The outputting of modulation signals from the modulation circuit 2 and the outputting of scanning signals from the scanning circuit 3 are synchronously performed. The scanning circuit 3 generally performs line sequential scanning by selecting each one line sequentially. However, the operation of the scanning circuit 3 is not limited to that, and may include skipping, selecting two or more lines at once, or selecting a plane. In this manner, the scanning circuit 3 functions as a selector that performs row selecting by applying selective potential, over a predetermined period of time, to the row wirings connected to the electron sources to be driven among the electron sources of the multi electron source 1, and applying non-selective potential to the row wirings during the other times.

The timing generating circuit 4 is a circuit that generates a timing signal. The timing signal includes control data for controlling the timing in each circuit of the modulation circuit 2, the scanning circuit 3, the data converting circuit 5, and the parallel/serial converting circuit 6.

The data converting circuit 5 is a circuit that converts the luminance gradation data, which is used for controlling the luminance gradation of the multi electron source 1 from the outside, into gradation data in a drive waveform data format that is suitable for the modulation circuit 2.

The parallel/serial converting circuit 6 is a circuit that converts each set of PHM data and PWM data of the luminance gradation data output by the data converting circuit 5, from parallel data to serial data.

The multi power source circuit 7 is a power source circuit that is designed to output plural power source values, and also is a circuit that controls the modulation circuit 2. The multi power source circuit 7 is generally a voltage source circuit, but is not necessarily limited to that.

The scanning power source circuit 8 is a power source circuit that outputs plural power source values, and also is a circuit that controls the scanning circuit 3. The scanning power source circuit 8 is generally a voltage source circuit, but is not necessarily limited to that.

Figure 2:
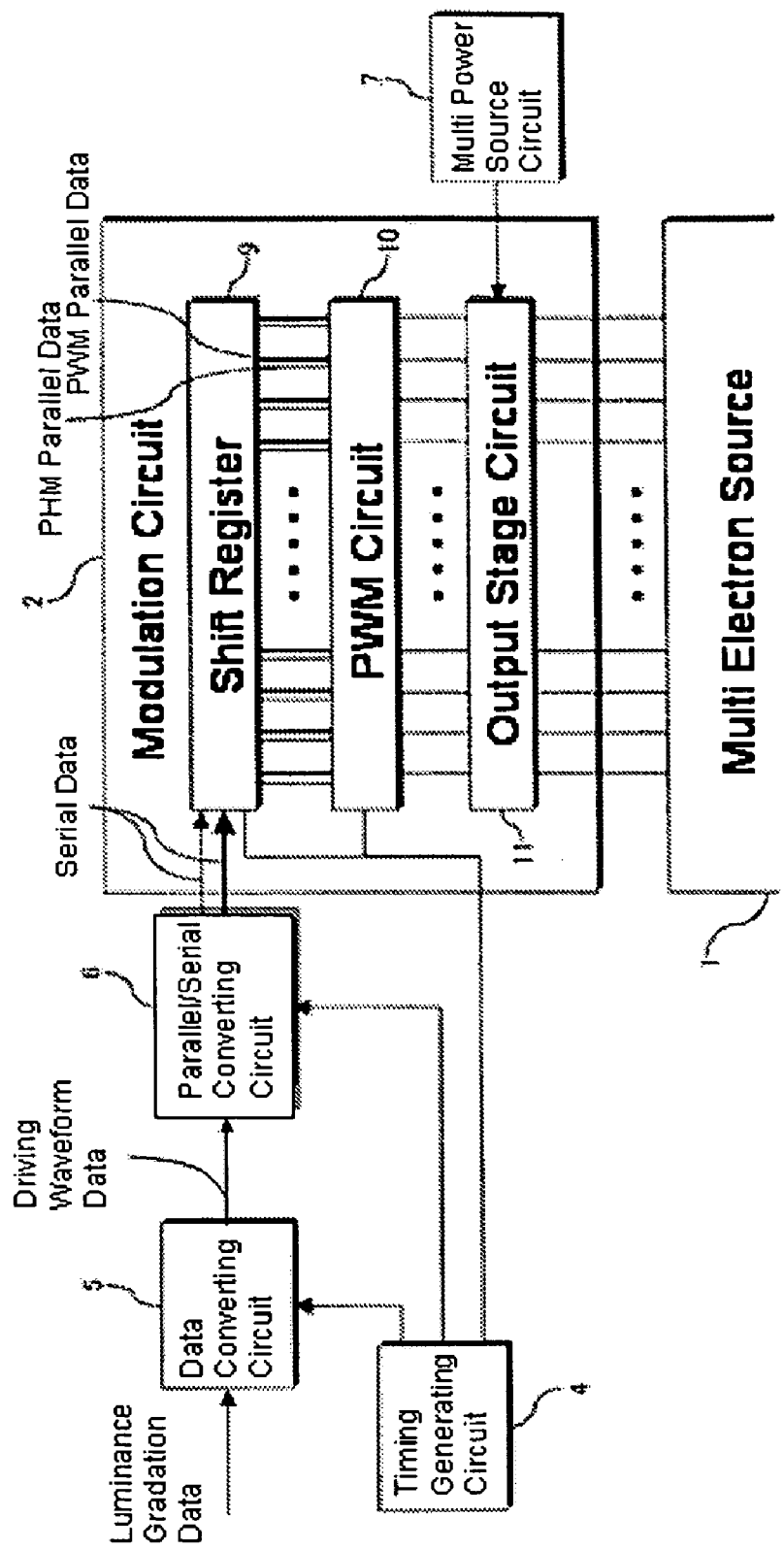
FIG. 2 is a block diagram of a modulation circuit provided in the driving circuit according to one embodiment of the present invention.

Next, the modulation circuit 2 is described. FIG. 2 illustrates the inner structure of the modulation circuit 2. As shown in FIG. 2, the modulation circuit 2 includes a shift register 9, a PWM circuit 10, and an output stage circuit 11.

PHM serial data and PWM serial data that are serial-converted by the parallel/serial converting circuit 6 are input to the shift register 9. The shift register 9 then transfers PHM parallel data and PWM parallel data that are modulation data according to the column wirings of the multi electron source 1.

The PHM parallel data and the PWM parallel data are input from the shift register 9 to the PWM circuit 10. The PWM circuit 10 in turn generates an output according to each output voltage of the output stage circuit 11.

Figure 3:
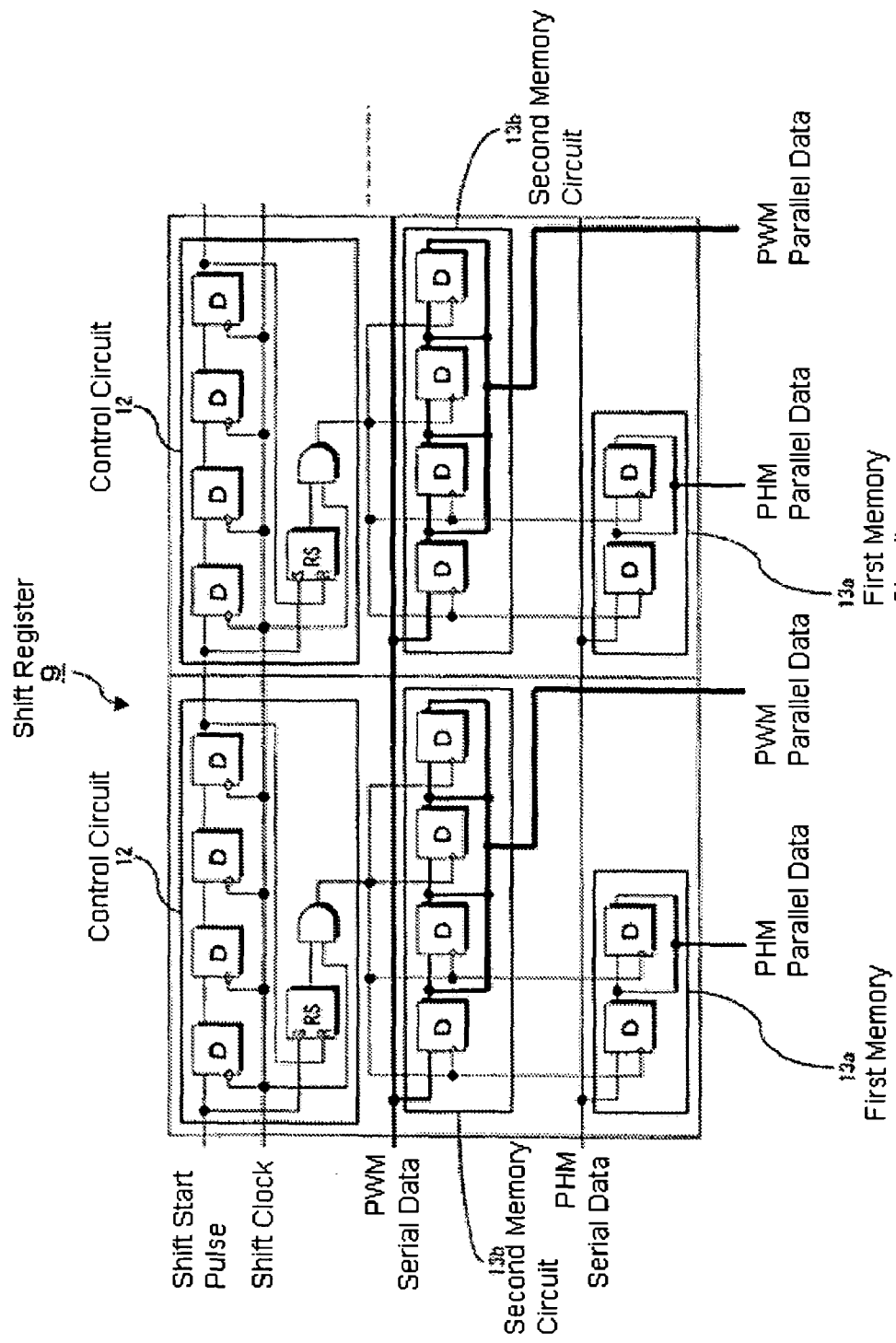
FIG. 3 is a block diagram of a shift register provided in the modulation circuit according to one embodiment of the present invention.
Figure 4:
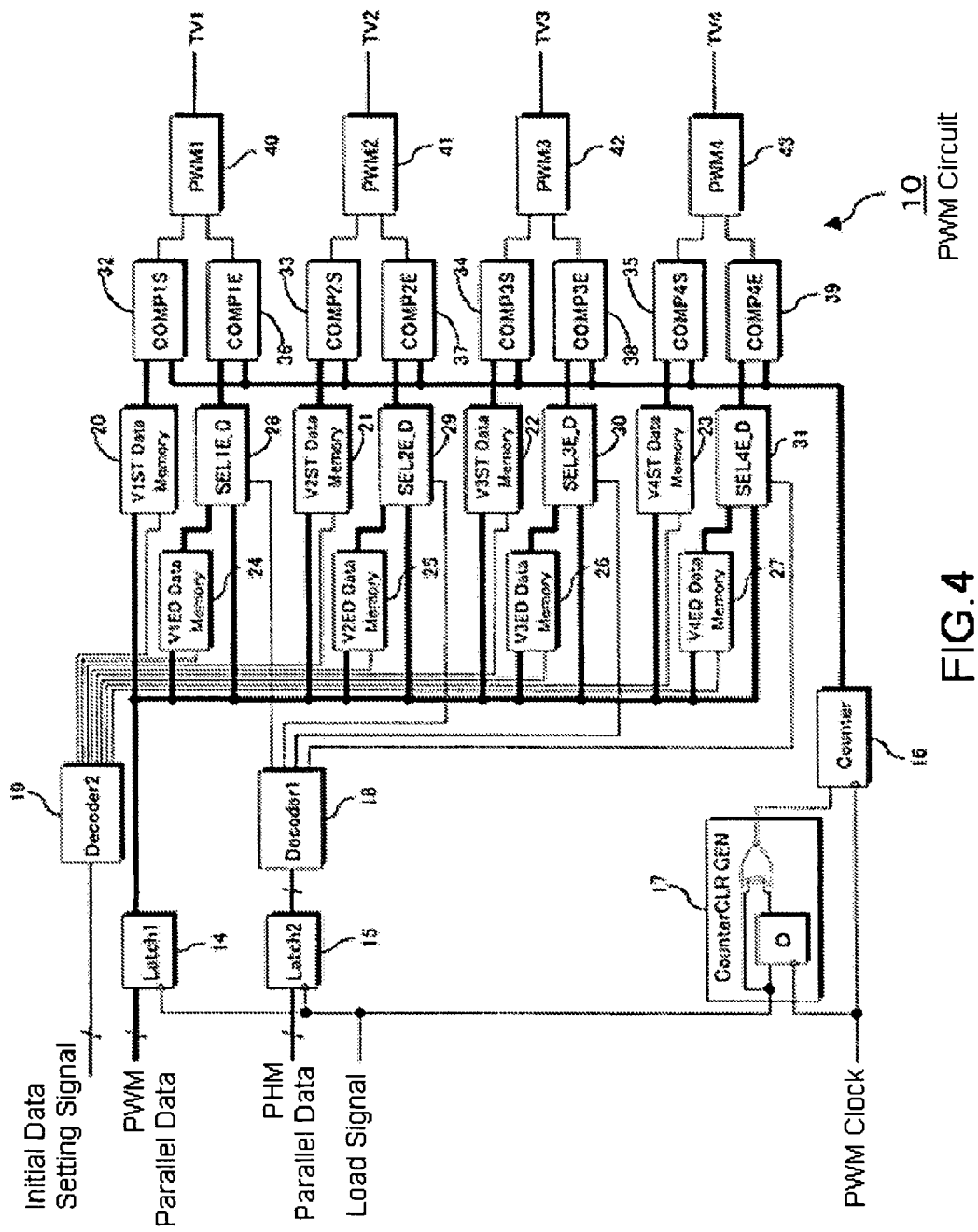
FIG. 4 is a block diagram of a PWM circuit provided in the modulation circuit according to one embodiment of the present invention.
Figure 5:
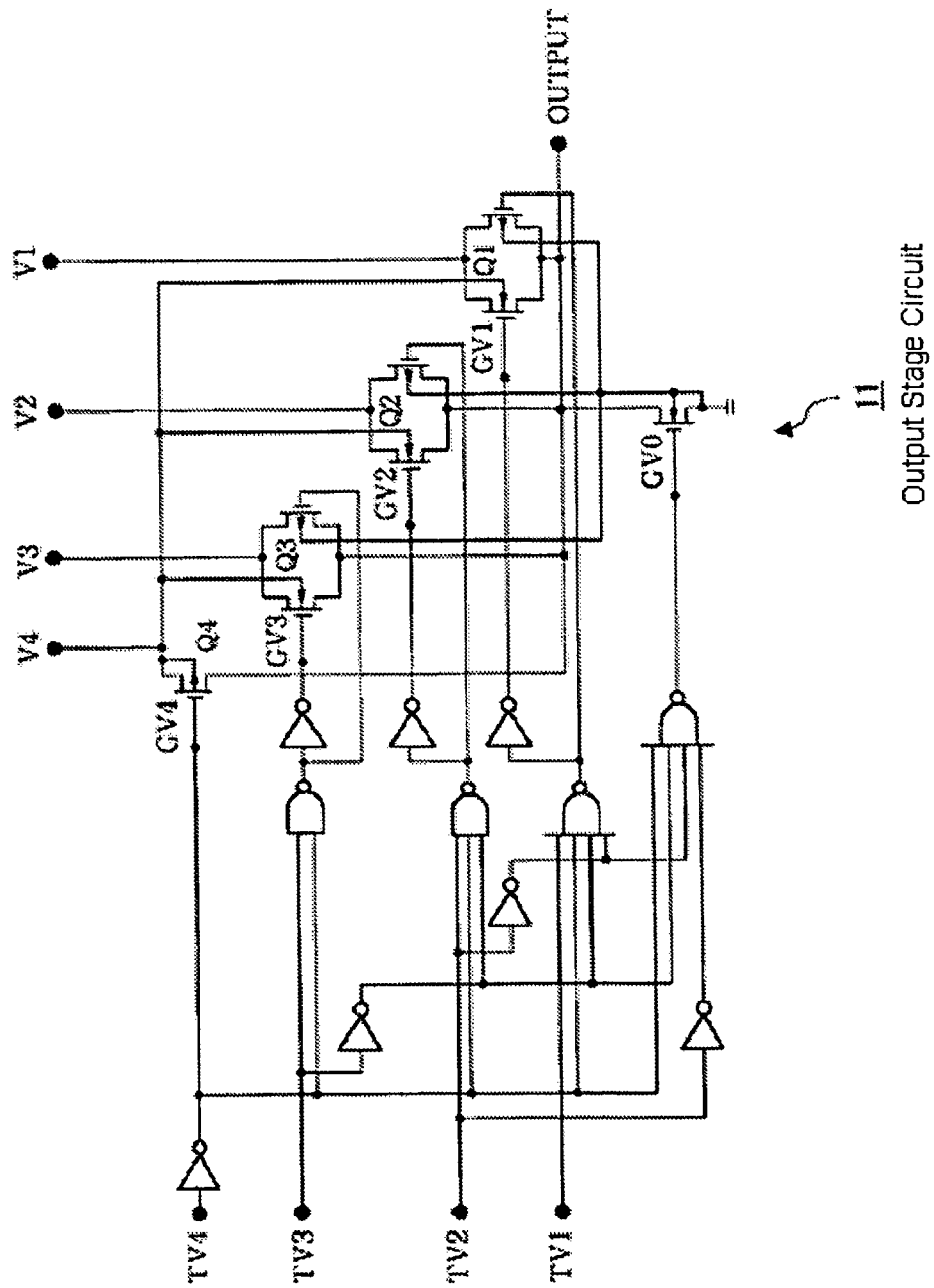
FIG. 5 is a block diagram of an output stage circuit provided in the modulation circuit according to one embodiment of the present invention.

Also, a timing signal for controlling the shift register 9 and the PWM circuit 10 is input from the timing generating circuit 4 to the shift register 9 and the PWM circuit 10. The output stage circuit 11 is connected to the multi power source circuit 7, and outputs a modulation signal with a after-mentioned driving waveform. FIG. 3 illustrates the inner structure of the shift register 9. FIG. 4 shows the PWM circuit 10 of FIG. 2, illustrating an example structure of the circuit that is provided for each one column wiring. FIG. 5 shows the output stage circuit 11 of FIG. 2, illustrating an example structure of the circuit that is provided for each one column wiring. Signals TV1, TV2, TV3, and TV4 are input from the PWM circuit 10 to the output stage circuit 11 of FIG. 5.

The signals TV1, TV2, TV3, and TV4 are signals for setting the amplitude value to be held by each component of a modulation signal, when the modulation signal is generated. More specifically, as the signal TV1 is switched to ON state, a rise of the amplitude value of the modulation signal is started. When the signal TV1 becomes ON, a transition control operation to change the modulation signal from the reference potential level of the modulation wirings to a amplitude value V1 is started. When the signal TV2 becomes ON, a transition control operation to change the amplitude value of the modulation signal from V1 to V2 is started, if necessary (whether it is necessary is determined by the gradation data). When the signal TV3 becomes ON, a transition control operation to change the amplitude value of the modulation signal from V2 to V3 is started, if necessary (whether it is necessary is determined by the gradation data). When the signal TV4 becomes ON, a transition control operation to change the amplitude value of the modulation signal from V3 to V4 is started, if necessary (whether it is necessary is determined by the gradation data).

Meanwhile, when the signal TV4 becomes OFF, a transition control operation to change the amplitude value from V4 to V3 is started. When the signal TV3 becomes OFF, a transition control operation to change the amplitude value from V3 to V2 is started. When the signal TV2 becomes OFF, a transition control operation to change the amplitude value from V2 to V1 is started. When the signal TV1 becomes OFF, a transition control operation to change the amplitude value from V1 to the reference level is started. After a start of each transition control operation, the amplitude value of the modulation signal approaches the target amplitude value over a transition time that is determined by the circuit structure or the structure of the electron sources. The amplitude value is then maintained in the neighborhood of the target amplitude value until a next transition is started.

A "rise" of a signal is a change of the signal level to such a higher level as to transmit greater energy. A "fall" of a signal is a change of the signal level to such a lower level (including the reference level) as to smaller energy. Accordingly, in a structure that makes the potential of a modulation level lower than the level of a scanning signal so as to increase the energy to be transmitted, a rise of a signal is initiated by lowering the potential of the signal. As for the transitions of the amplitude value, the potential is lowered from V1 to V2, from V2 to V3, and from V3 to V4. In this case, the amplitude value establishes the following relationship: V1<V2<V3<V4.

As shown in FIG. 3, the shift register 9 includes plural control circuits 12 and memory circuits 13. In this embodiment, D flip-flop circuits, RS flip-flop circuits, and AND gate circuits are employed. However, the structures of the control circuits 12 and the memory circuits 13 are not limited to those.

PHM serial data that is serial-converted by the parallel/serial converting circuit 6 is input to first memory circuits 13a. The first memory circuits 13a then transfer PHM parallel data that is the modulation data corresponding to the column wirings of the multi electron source 1.

PWM serial data that is serial-converted by the parallel/serial converting circuit 6 is input to second memory circuits 13b. The second memory circuits 13b then transfer PWM parallel data that is modulation data corresponding to the column wirings of the multi electron source 1.

A shift start pulse that is one of timing signals generated by the timing generating circuit 4 and a shift clock are input to the control circuits 12. The control circuits 12 then generate record control signals. The record control signals are used for recording the PHM serial data and PWM serial data, which are the modulation data corresponding to the column wirings of the multi electron source 1, in the first memory circuits 13a and the second memory circuits 13b.

According to the record control signals generated by the control circuits 12, the PHM serial data is recorded in the first memory circuits 13a, and the PWM serial data is recorded in the second memory circuits 13b.

The data that are output from the first memory circuits 13a and the second memory circuits 13b are parallel data, and are output to the PWM circuit 10 through the column wirings of the multi electron source 1.

Figure 7:
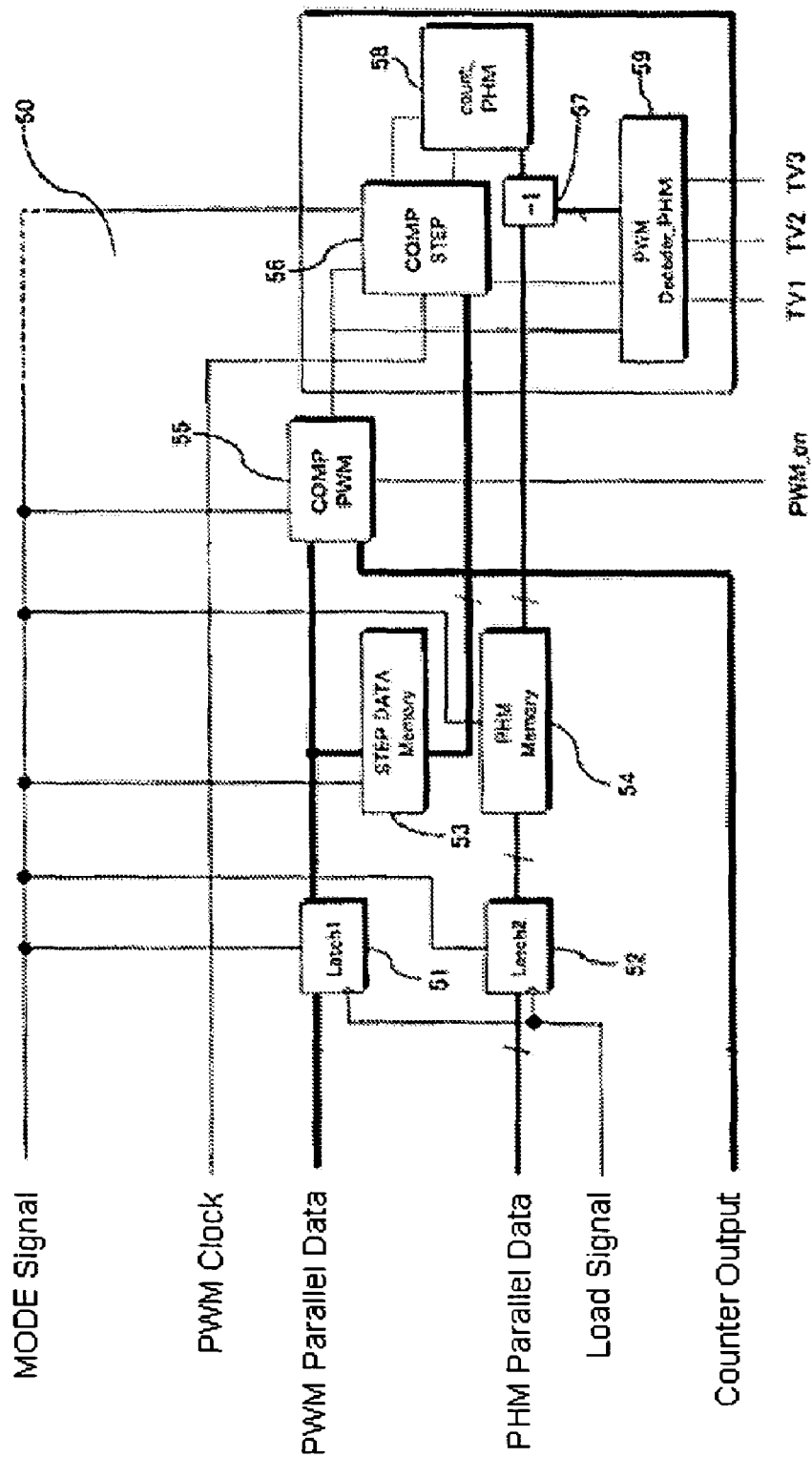
FIG. 7 is a block diagram of a falling waveform circuit in PWM driving according to one embodiment of the present invention.
Figure 8:
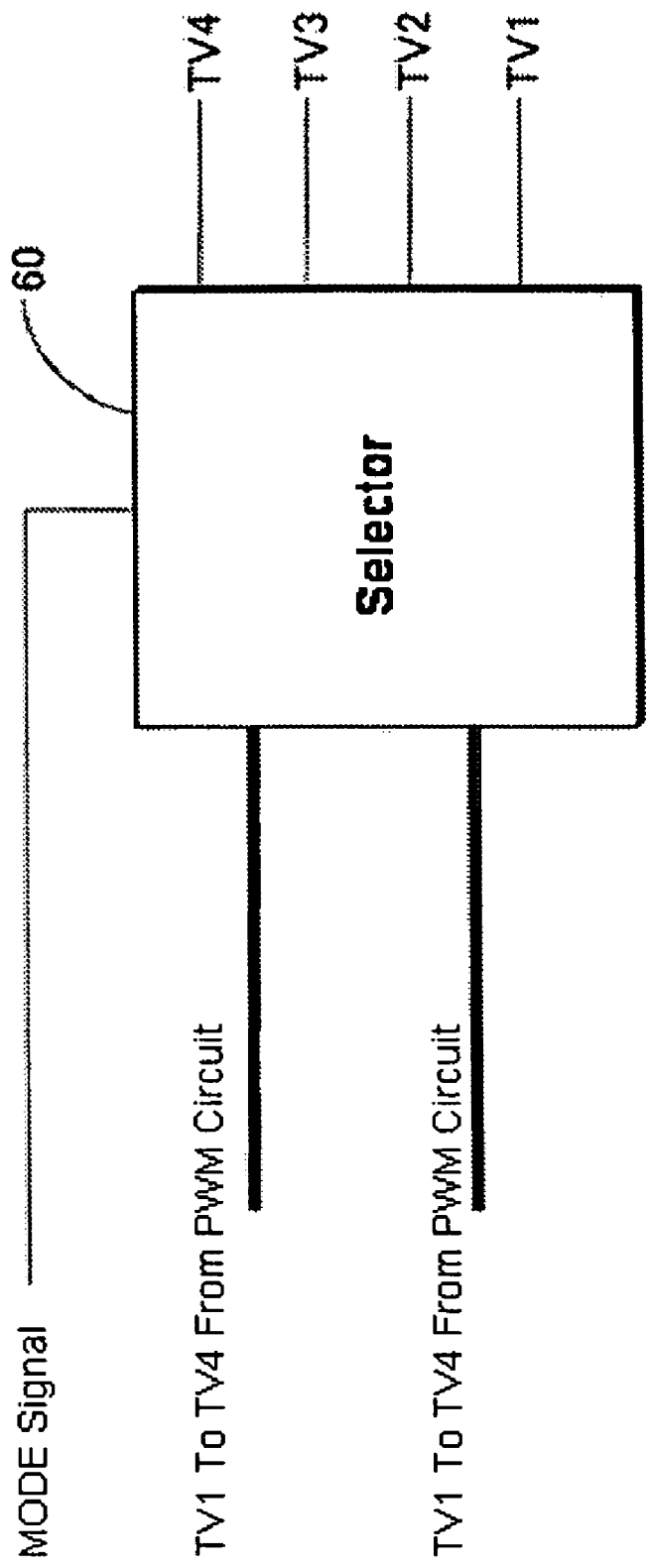
FIG. 8 is a block diagram of a selector circuit according to one embodiment of the present invention.

Referring now to FIGS. 4, 7, and 8, the PWM circuit 10 will be described. The PWM circuit 10 illustrated in FIGS. 4, 7, and 8 is merely an example, and is not limited to this circuit structure.

In this embodiment, the structure is designed to generate modulation signals in two different operating modes. In either of the operating modes, waveform data is stored in a memory circuit of the PWM circuit 10 in advance, and the waveform of each modulation signal is determined using the waveform data and the PWM and PHM data that are sequentially input gradation data.

FIG. 4 shows the circuit that generates the signals TV1 through TV4 for determining the amplitude value of each modulation signal in first operating mode (hereinafter also referred to as the regular driving mode).

The circuit shown in FIG. 4 includes a PWM parallel data latch circuit 14 and a PHM parallel data latch circuit 15 as latch circuits. This PWM circuit 10 also has a counter circuit 16 and a counter clearing signal generating circuit 17 as counter-related circuits. In this embodiment, the counter clearing signal generating circuit 17 includes a D flip-flop circuit and an XOR circuit. However, this circuit structure is merely an example, and the counter clearing signal generating circuit 17 is not necessarily limited to this structure.

As for decoding circuits, the PWM circuit 10 includes a PHM data decoding circuit 18 and an initial data setting signal decoding circuit 19. Also, as memory circuits, the PWM circuit 10 includes a V1 start data memory circuit 20, a V2 start data memory circuit 21, a V3 start data memory circuit 22, a V4 start data memory circuit 23, a V1 end data memory circuit 24, a V2 end data memory circuit 25, a V3 end data memory circuit 26, and a V4 end data memory circuit 27.

As end data selecting circuits, the PWM circuit 10 includes a V1 end data selecting circuit 28, a V2 end data selecting circuit 29, a V3 end data selecting circuit 30, and a V4 end data selecting circuit 31. As for data comparing circuits, the PWM circuit 10 includes a V1 start data comparator 32, a V2 start data comparator 33, a V3 start data comparator 34, a V4 start data comparator 35, a V1 end data comparator 36, a V2 end data comparator 37, a V3 end data comparator 38, and a V4 end data comparator 39.

As pulse width defining timing signal generating circuits that generate the signals TV1 through TV4, the PWM circuit 10 includes a V1 pulse width generating circuit 40, a V2 pulse width generating circuit 41, a V3 pulse width generating circuit 42, and a V4 pulse width generating circuit 43.

Next, the above-described structure of this embodiment will be described in greater detail.

The PWM parallel data latch circuit 14 is a circuit to latch the PWM parallel data that is recorded in the second memory circuits 13b in the shift resister 9 and is the modulation data corresponding to the column wirings of the multi electron source 1. The PWM parallel data latch circuit 14 latches the PWM parallel data in the timing of a load signal that is one of the timing signals generated by the timing generating circuit 4.

The PHM parallel data latch circuit 15 is a circuit to latch the PHM parallel data that is recorded in the first memory circuits 13a in the shift resister 9 and is the modulation data corresponding to the column wirings of the multi electron source 1. The PHM parallel data latch circuit 15 latches the PHM parallel data in the timing of the load signal that is one of the timing signals generated by the timing generating circuit 4.

The counter circuit 16 is a circuit to output count data that defines the internal timing to the V1 start data comparator 32, the V2 start data comparator 33, the V3 start data comparator 34, the V4 start data comparator 35, the V1 end data comparator 36, the V2 end data comparator 37, the V3 end data comparator 38, and the V4 end data comparator 39. The counter circuit 16 outputs the count data, based on a PWM clock that is one of the timing signals generated by the timing generating circuit 4 and a counter clearing signal that is generated by the counter clearing signal generating circuit 17.

The counter clearing signal generating circuit 17 is a circuit to generate the counter clearing signal, which defines the internal timing, based on the load signal and the PWM clock that are among the timing signals generated by the timing signal generating circuit 4.

The PHM data decoding circuit 18 is a decoding circuit to generate selecting signals for the V1 end data selecting circuit 28, the V2 end data selecting circuit 29, and the V3 end data selecting circuit 30, according to the PHM parallel data that are latched by the PHM parallel data latch circuit 15.

In this embodiment, four selecting signals are generated from 2-bit PHM parallel data. More specifically, in a case where the PHM data is "00", the selecting signal for the V1 end data selecting circuit 28 is "1", and the selecting signals for the other selecting circuits are "0". Here, "00" indicates the numerical value in the binary fashion. In a case where the PHM data is "01", the selecting signal for the V2 end data selecting circuit 29 is "1", and the selecting signals for the other selecting circuits are "0". In a case where the PHM data is "10", the selecting signal for the V3 end data selecting circuit 30 is "1", and the selecting signals for the other selecting circuits are "0". In a case where the PHM data is "11", the selecting signal for the V4 end data selecting circuit 31 is "1", and the selecting signals for the other selecting circuits are "0".

The initial data setting signal decoding circuit 19 in the PWM circuit 10 is a circuit to determine the timing in which waveform data is stored in the V1 start data memory circuit 20, the V2 start data memory circuit 21, the V3 start data memory circuit 22, the V4 start data memory circuit 23, the V1 end data memory circuit 24, the V2 end data memory circuit 25, the V3 end data memory circuit 26, and the V4 end data memory circuit 27, which are memory circuits to store waveform data. The initial data setting signal decoding circuit 19 determines the timing, according to an initial data setting signal. More specifically, since the waveform data is sent to those memory circuits in the same manner as the gradation data, the decoding circuit 19 determines the timing for each memory circuit to receive the waveform data, so that the waveform data can be distinguished from the gradation data and can be stored as waveform data. Accordingly, the decoding circuit 19 generates a write signal for writing input data as the waveform data in each memory signal. The initial data setting signal is one of the timing signals generated by the timing generating circuit 4. The above write signal is a signal for recording the PWM data, which is latched by the PWM parallel data latch circuit 14, as the waveform data.

In this embodiment, eight selecting signals are generated, according to the 3-bit initial data setting signal.

More specifically, in a case where the initial data setting signal is "000", only the write signal for the V1 start data memory circuit 20 becomes ON, and the PWM data latched by the PWM parallel data latch circuit 14 is recorded as waveform data in the V1 start data memory circuit 20. The recorded waveform data is to be used for determining the timing to start the transition from the reference level to the amplitude value V1.

In a case where the initial data setting signal is "001", only the write signal for the V2 start data memory circuit 21 becomes ON, and the PWM data latched by the PWM parallel data latch circuit 14 is recorded as waveform data in the V2 start data memory circuit 21. The recorded waveform data is to be used for determining the timing to start the transition from the amplitude value V1 in a controlled state to the amplitude value V2.

In a case where the initial data setting signal is "010", only the write signal for the V3 start data memory circuit 22 becomes ON, and the PWM data latched by the PWM parallel data latch circuit 14 is recorded as waveform data in the V3 start data memory circuit 22. The recorded waveform data is to be used for determining the timing to start the transition from the amplitude value V2 in a controlled state to the amplitude value V3.

In a case where the initial data setting signal is "011", only the write signal for the V4 start data memory circuit 23 becomes ON, and the PWM data latched by the PWM parallel data latch circuit 14 is recorded as waveform data in the V4 start data memory circuit 23. The recorded waveform data is to be used for determining the timing to start the transition from the amplitude value V3 in a controlled state to the amplitude value V4.

In a case where the initial data setting signal is "100", only the write signal for the V1 end data memory circuit 24 becomes ON, and the PWM data latched by the PWM parallel data latch circuit 14 is recorded as waveform data in the V1 end data memory circuit 24. The recorded waveform data is to be used for determining the timing to start the transition from the amplitude value V1 in a controlled state to the reference level.

In a case where the initial data setting signal is "101", only the write signal for the V2 end data memory circuit 25 becomes ON, and the PWM data latched by the PWM parallel data latch circuit 14 is recorded as waveform data in the V2 end data memory circuit 25. The recorded waveform data is to be used for determining the timing to start the transition from the amplitude value V2 in a controlled state to the amplitude value V1.

In a case where the initial data setting signal is "110", only the write signal for the V3 end data memory circuit 26 becomes ON, and the PWM data latched by the PWM parallel data latch circuit 14 is recorded as waveform data in the V3 end data memory circuit 26. The recorded waveform data is to be used for determining the timing to start the transition from the amplitude value V3 in a controlled state to the amplitude value V2.

In a case where the initial data setting signal is "111", only the write signal for the V4 end data memory circuit 27 becomes ON, and the PWM data latched by the PWM parallel data latch circuit 14 is recorded as waveform data in the V4 end data memory circuit 27. The recorded waveform data is to be used for determining the timing to start the transition from the amplitude value V4 in a controlled state to the amplitude value V3.

During the non-image display period including a device activating period, the parameters (V1 start data, V2 start data, V3 start data, V4 start data, V1 end data, V2 end data, V3 end data, and V4 end data) for forming the after-mentioned driving waveform are sequentially transferred as the luminance gradation value data to the data memory circuits 20 through 27 in which the PWM data are recorded as the waveform data. Accordingly, the parameters (V1 start data, V2 start data, V3 start data, V4 start data, V1 end data, V2 end data, V3 end data, and V4 end data), which are the "rising" timing data and the "falling" timing data, are recorded in the data memory circuits 20 through 27. In the after-mentioned comparators 32 through 39, those waveform data are to be compared with count values that are output by the counter 16. When waveform data matches with the corresponding count value, the corresponding comparator inverts the output signal level, so that the timing can be determined according to the waveform data.

The V1 end data selecting circuit 28 of the PWM circuit 10 is a selecting circuit that selects either the PWM data latched by the PWM parallel data latch circuit 14 or the V1 end data recorded in the V1 end data memory circuit 24. The selection is carried out with the selecting signal corresponding to the PHM data that is output by the PHM data decoding circuit 18.

The V2 end data selecting circuit 29 is a selecting circuit that selects either the PWM data latched by the PWM parallel data latch circuit 14 or the V2 end data recorded in the V2 end data memory circuit 25. The selection is carried out with the selecting signal corresponding to the PHM data that is output by the PHM data decoding circuit 18.

Likewise, the V3 end data selecting circuit 30 is a selecting circuit that selects either the PWM data latched by the PWM parallel data latch circuit 14 or the V3 end data recorded in the V3 end data memory circuit 26. The selection is carried out with the selecting signal corresponding to the PHM data that is output by the PHM data decoding circuit 18.

The V4 end data selecting circuit 31 is also a selecting circuit that selects either the PWM data latched by the PWM parallel data latch circuit 14 or the V4 end data recorded in the V4 end data memory circuit 27. The selection is carried out with the selecting signal corresponding to the PHM data that is output by the PHM data decoding circuit 18.

With the V1 through V4 end data selecting circuits 28 through 31, the time width of the portion in which the timing to start a amplitude value transition is determined based on the corresponding gradation data, or the time width of the portion of the maximum amplitude value with which a modulation signal is requested through the gradation data, can be determined by the gradation data, instead of waveform data. More specifically, if the modulation signal corresponding to some gradation data is a signal that requires up to the amplitude value V4, the timing to drop the signal from the controlled state in which the amplitude value is maintained at V4 (or the timing to start a transition to the amplitude value V3) is determined by the gradation data. The other amplitude value transitions are started at the timings according to the waveform data. Also, if the modulation signal corresponding to some gradation data is a signal that requires up to the amplitude value V3 (the maximum amplitude value for this modulation signal is V3, and the amplitude value V4 is not necessary), the timing to drop the signal from the controlled state in which the amplitude value is maintained at V3 to the amplitude value V2 is determined by the gradation data. The other amplitude value transitions are started at the timings according to the waveform data.

The V1 start data comparator 32 is a comparator to generate a V1 start pulse when the V1 start data recorded in the V1 start data memory circuit 20 matches the count data in the counter circuit 16 that defines the internal timing. The V2 start data comparator 33 is a comparator to generate a V2 start pulse when the V2 start data recorded in the V2 start data memory circuit 21 matches the count data in the counter circuit 16. The V3 start data comparator 34 is a comparator to generate a V3 start pulse when the V3 start data recorded in the V3 start data memory circuit 22 matches the count data in the counter circuit 16. The V4 start data comparator 35 is a comparator to generate a V4 start pulse when the V4 start data recorded in the V4 start data memory circuit 23 matches the count data in the counter circuit 16. With this structure, the step-like portions representing rises of a modulation signal can be defined by the V1 start data through the V4 start data that are waveform data.

The V1 end data comparator 36 is a comparator to generate a V1 end pulse when the V1 end data or the PWM data selected by the V1 end data selecting circuit 28 matches the count data in the counter circuit 16. The V2 end data comparator 37 is a comparator to generate a V2 end pulse when the V2 end data or the PWM data selected by the V2 end data selecting circuit 29 matches the count data in the counter circuit 16. The V3 end data comparator 38 is a comparator to generate a V3 end pulse when the V3 end data or the PWM data selected by the V3 end data selecting circuit 30 matches the count data in the counter circuit 16. The V4 end data comparator 39 is a comparator to generate a V4 end pulse when the V4 end data or the PWM data selected by the V4 end data selecting circuit 31 matches the count data in the counter circuit 16.

The V1 pulse width generating circuit 40 is a PWM circuit to output a pulse width waveform TV1. The pulse width waveform TV1 rises with the V1 start pulse generated by the V1 start data comparator 32, and falls with the V1 end pulse generated by the V1 end data comparator 36.

The V2 pulse width generating circuit 41 is a PWM circuit to output a pulse width waveform TV2. The pulse width waveform TV2 rises with the V2 start pulse generated by the V2 start data comparator 33, and falls with the V2 end pulse generated by the V2 end data comparator 37.

The V3 pulse width generating circuit 42 is a PWM circuit to output a pulse width waveform TV3. The pulse width waveform TV3 rises with the V3 start pulse generated by the V3 start data comparator 34, and falls with the V3 end pulse generated by the V3 end data comparator 38.

The V4 pulse width generating circuit 43 is a PWM circuit to output a pulse width waveform TV4. The pulse width waveform TV4 rises with the V4 start pulse generated by the V4 start data comparator 35, and falls with the V4 end pulse generated by the V4 end data comparator 39.

In this embodiment, RS flip-flop circuits that have start pulses input to the set inputs and end pulses input to the reset inputs are employed as the PWM circuits 40 through 43, but the present invention is not limited to that structure.

As shown in FIG. 5, the potentials V1 through V4 in the output stage circuit 11 have the relationship of $0<V1<V2<V3<V4$, and are output in accordance with the PWM output waveforms TV1, TV2, TV3, and TV4, respectively. Transistors Q1, Q2, Q3, and Q4 are configured to output the potentials V1 through V4 to the output terminal OUTPUT, when turned on. Each of the transistors Q1 through Q4 may be formed with two or more transistors for each potential.

Referring now to FIGS. 6A through 6D, the driving waveforms to be output from the output terminal OUTPUT of the modulation circuit 2 configured as above are described.

Figure 6:
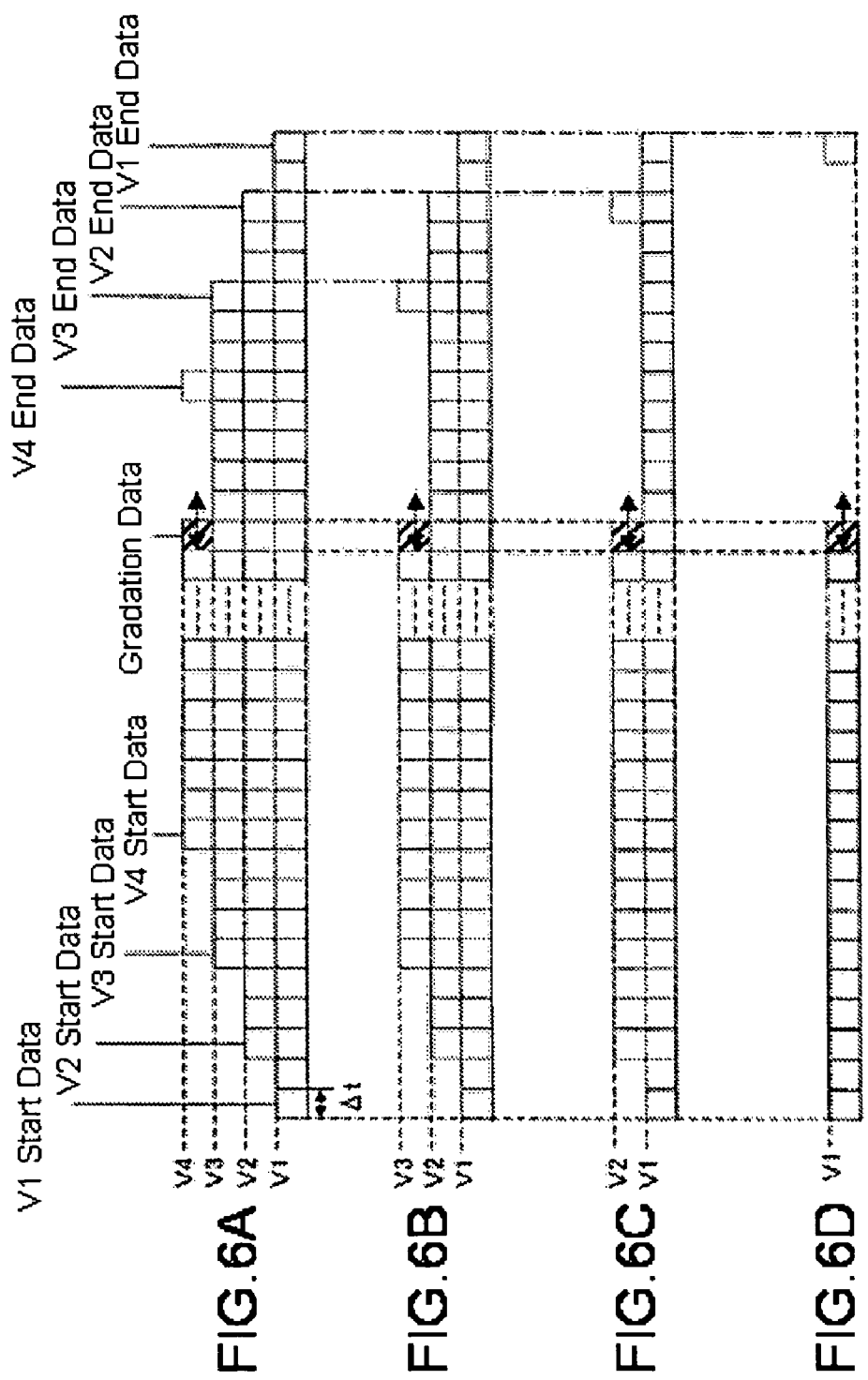
FIGS. 6A through 6D are schematic diagrams illustrating examples of waveforms that are output from the output stage circuit provided in the modulation circuit according to one embodiment of the present invention.

FIG. 6A shows the driving waveform with the potentials V1 through V4 in the case where the PHM data as the gradation data is "11". As shown in FIG. 6A, the position of the rising of the potential V1 is determined by the V1 start data stored in the V1 start data memory circuit 20. The position of the rising of the potential V2 is determined by the V2 start data stored in the V2 start data memory circuit 21. The position of the rising of the potential V3 is determined by the V3 start data stored in the V3 start data memory circuit 22. The position of the rising of the potential V4 is determined by the V4 start data stored in the V4 start data memory circuit 23.

Meanwhile, the position of the falling of the potential V1 is determined by the V1 end data that are waveform data stored in the V1 end data memory circuit 24. The position of the falling of the potential V2 is determined by the V2 end data that are waveform data stored in the V2 end data memory circuit 25. The position of the falling of the potential V3 is determined by the V3 end data that are waveform data stored in the V3 end data memory circuit 26. The position of the falling of the potential V4 is determined by the PWM data that are the gradation data.

FIG. 6B shows the driving waveform employing the potentials V1 through V3 in the case where the PHM data is "10".

As shown in FIG. 6B, the position of the rising of the potential V1 is determined by the V1 start data stored in the V1 start data memory circuit 20. The position of the rising of the potential V2 is determined by the V2 start data stored in the V2 start data memory circuit 21. The position of the rising of the potential V3 is determined by the V3 start data stored in the V3 start data memory circuit 22.

Meanwhile, the position of the falling of the potential V1 is determined by the V1 end data stored in the V1 end data memory circuit 24. The position of the falling of the potential V2 is determined by the V2 end data stored in the V2 end data memory circuit 25. The position of the falling of the potential V3 is determined by the PWM data that are the gradation data.

FIG. 6C shows the driving waveform employing the potentials V1 and V2 in the case where the PHM data is "01". As shown in FIG. 6C, the position of the rising of the potential V1 is determined by the V1 start data stored in the V1 start data memory circuit 20. The position of the rising of the potential V2 is determined by the V2 start data stored in the V2 start data memory circuit 21. The position of the falling of the potential V1 is determined by the V1 end data stored in the V1 end data memory circuit 24. The position of the falling of the potential V2 is determined by the PWM data that are the gradation data.

FIG. 6D shows the driving waveform with the potential V1 in the case where the PHM data is "01". As shown in FIG. 6D, the position of the rising of the potential V1 is determined by the V1 start data stored in the V1 start data memory circuit 20. The position of the falling of the potential V1 is determined by the PWM data that are the gradation data.

As described above, in the first operating mode, the V1 start data, the V2 start data, the V3 start data, the V4 start data, the V1 end data, the V2 end data, the V3 end data, and the V4 end data, which are waveform data, are commonly used in generating modulation signals. At least part of these data is rewritten, so as to change the step-like shape of a rising portion or a falling portion of a modulation signal. For example, to increase the time width of the portion to be controlled at the amplitude value V1 in the rising portion of a modulation signal, the V2 start data should be set so as to delay the timing to start the transition from the amplitude value V1 to the amplitude value V2, which is defined by the V2 start data.

The PWM circuit 10 of this embodiment can select the other operating mode (hereinafter also referred to as the "PWM driving"). The PWM circuit 10 further includes a falling waveform circuit 50 to realize the other operating mode, in addition to the circuit shown in FIG. 4. In the other operating mode, the circuit shown in FIG. 4 is used to generate the signal for determining the timing to set the shape of the rising portion of a modulation signal, and the falling waveform circuit 50 having a different structure from the circuit shown in FIG. 4 is used to generate the signal to determine the timing to set the shape of the falling portion of the modulation signal. The switching is performed with a selector 60 shown in FIG. 8.

FIG. 7 shows the falling waveform circuit 50 that generates the falling waveform in the pulse width modulation (PWM) driving. The falling waveform circuit 50 includes a PWM parallel data latch circuit 51, a PHM parallel data latch circuit 52, a falling step number memory circuit 53 that serves as a memory circuit to store waveform data, a PHM parallel data memory circuit 54, a PWM parallel data comparator circuit 55, a step number comparator circuit 56, a data subtractor 57, a PHM count circuit 58, and a PWM pulse width circuit 59.

Among these, the PWM parallel data latch circuit 51 is a circuit to latch the PWM parallel data that is recorded in the second memory circuits 13b in the shift register 9 and is the modulation data (the gradation data) corresponding to the column wirings of the multi electron source 1. The PWM parallel data latch circuit 51 latches the PWM parallel data at the timing set by a load signal that is one of the timing signals generated by the timing generating circuit 4.

The PHM parallel data latch circuit 52 is a circuit to latch the PHM parallel data that is recorded in the first memory circuits 13a in the shift register 9 and is the modulation data corresponding to the column wirings of the multi electron source 1. The PHM parallel data latch circuit 52 latches the PHM parallel data at the timing set by a load signal that is one of the timing signals generated by the timing generating circuit 4.

The falling step number memory circuit 53 records the step number data that is waveform data transferred through the PWM parallel data bus, in accordance with a MODE signal containing an initial data setting signal that is one of the timing signals generated by the timing generating circuit 4.

The PHM parallel data memory circuit 54 is a circuit to record the PHM parallel data. The PWM parallel data comparator circuit 55 is a comparator to generate pulses when the PWM data matches the count data in the counter circuit 16 that determines the internal timing.

The step number comparator circuit 56 is a comparator to generate pulses when the step number data to set each potential output period at the time of waveform falling matches the count data in the counter circuit 16 that determines the internal timing.

The data subtractor 57 subtracts "1" from the PHM data stored in the PHM parallel data memory circuit 54, and holds the subtracted value.

The PHM count circuit 58 counts the output pulse generated from the step number comparator circuit 56 as a count pulse, and outputs a signal to stop the step number comparator circuit 56 when the count data matches the output from the data subtractor 57.

The PWM pulse width circuit 59 is a circuit that receives the output from the step number comparator circuit 56, and outputs the falling timing of each potential, based on the PHM data output from the data subtractor 57.

Next, the operation of the driving circuit of this embodiment will be described.

First, during a non-image display period including the time of activating the device, the V1 through V4 start data and the V1 through V4 end data are sent as the parameters (waveform data) for forming driving waveforms, to the memory circuits 20 through 27 shown in FIG. 4. As in the first driving mode, the waveform data is stored in the memory circuits 20 through 27. The step number data that is also waveform data is sent to the memory circuit 53, shown in FIG. 7, via the same bus as the bus via which the luminance gradation data is sent.

If the PWM driving is selected with a MODE signal, the PWM parallel data comparator circuit 55 compares the PWM data with the counter output. As a result of the comparison, the timing in which the PWM data as gradation data matches the counter output is set as the timing to start such a signal control operation on a modulation signal that the modulation signal falls from the maximum amplitude value. When the matching is detected, the pulse to start the operation is output to the step number comparator circuit 56 and the selector 60.

In the step number comparator circuit 56, the step data that is a data value for setting each potential output period at the time of waveform falling (the waveform data that is output by the memory circuit 53) is compared with an input PCLK number. If the step data matches the input PCLK number, the step number comparator circuit 56 outputs pulses to the PHM count circuit 58 and the PWM pulse width circuit 59.

The PHM count circuit 58 compares the value held in the data subtractor 57 with the number of pulses output from the step number comparator circuit 56. If the value held in the data subtractor 57 matches the number of pulses output from the step number comparator circuit 56, the operation of the step number comparator circuit 56 is stopped. On the other hand, if the value held in the data subtractor 57 does not match the number of pulses output from the step number comparator circuit 56, the count number of the step number comparator circuit 56 is reset, and the above-described comparison is resumed.

As the pulses are output from the PWM parallel data comparator circuit 55 to the PWM pulse width circuit 59, the PWM pulse width circuit 59 outputs the pulse width waveform corresponding to the PHM data value held in the data subtractor 57.

More specifically, the following procedures are carried out.

1) In a case where the potential corresponding to the PHM data value is V3 (where the maximum amplitude value of the modulation signal corresponding to certain gradation data is V3, and the potential V4 is not to be used for the modulation signal), for example, the pulse width waveforms TV1 through TV3 for the falling waveform at each potential equal to or lower than V3 are output.

2) In a case where the potential corresponding to the PHM data value is V2 (where the maximum amplitude value of the modulation signal corresponding to certain gradation data is V2, and the potentials V3 and V4 are not to be used for the modulation signal), the pulse width waveforms TV1 and TV2 for the falling waveform at each potential equal to or lower than V2 are output.

3) In a case where the potential corresponding to the PHM data value is V1 (where the maximum amplitude value of the modulation signal corresponding to certain gradation data is V1, and the potentials V2, V3, and V4 are not to be used for the modulation signal), the pulse width waveform TV1 for the falling waveform at the potential V1 is output.

In the case of 1), the pulse width waveform TV3 for determining the timing to shift from the amplitude value V3 to V2 is output using the PWM data as the gradation data. The PWM pulse width circuit 59 then outputs the signal to determine the timing for the transition to the next potential (a lower potential), every time a pulse output from the step number comparator circuit 56 is detected. The outputting is repeated until TV1 is output. In this manner, the falling portion of the PWM driving is formed.

After the timing to perform the control operation to fall from the maximum amplitude value using the PWM data as the gradation data, the PWM pulse width circuit 59 outputs the signal to determine the timing to start the transition control from each amplitude value to a smaller amplitude value at the intervals based on the step data as the waveform data, instead of the gradation data.

As shown in FIG. 8, the pulse width waveforms TV1 through TV3 output from the falling waveform circuit 50 are supplied to the selector 60. Also, the pulse width waveforms TV1 through TV4 output from the PWM circuit 10 are supplied to the selector 60.

In the normal driving (new Vn driving), the pulse width waveforms TV1 through TV4 supplied from the PWM circuits 40 through 43 shown in FIG. 4 pass through the selector 60, and are then supplied to the output stage circuit 11 shown in FIG. 5. Thus, in the normal driving, the rising and falling control is performed on a modulation signal at the timing determined by the signals supplied from the PWM circuits 40 through 43.

Next, a case where the PWM driving is selected through the MODE signal will be described. In such a case, the selector 60 functions in accordance with the output signal PWM_on from the PWM parallel data comparator circuit 55.

More specifically, the following two procedures are selectively carried out.

1) The normal driving is performed until the output signal PWM_on is supplied, and the "pulse width waveforms TV1 through TV4 from the PWM circuits 40 through 43" pass through the selector 60, and are output. Accordingly, in the PWM driving mode, the rising of each modulation signal is controlled by the timing signals output from the PWM circuits 40 through 43.

2) Once the output signal PWM_on is input, the "pulse width waveforms TV1 through TV3 from the falling waveform circuit 50" are selected and output. Accordingly, the falling of each modulation signal is controlled by the timing signal output from the PWM circuit 59.

In this manner, mode switching is performed between the two driving modes.

As described above, in the PWM driving mode, at least one of V1 through V4 start data is rewritten, so that the step-like shape of the rising portion of each modulation signal can be modified. More specifically, the time width of the rising portion to be adjusted to each amplitude value can be modified.

By rewriting the step data, the time width of the falling portion to be adjusted to each amplitude value can be modified.

Figure 9A:
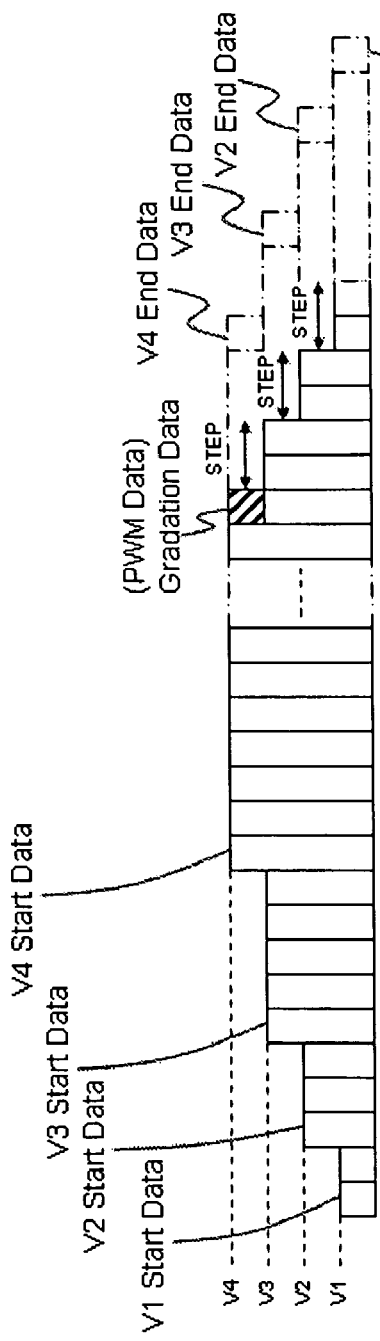
FIGS. 9A and 9B are schematic diagrams illustrating examples of output driving waveforms according to one embodiment of the present invention.
Figure 9B:
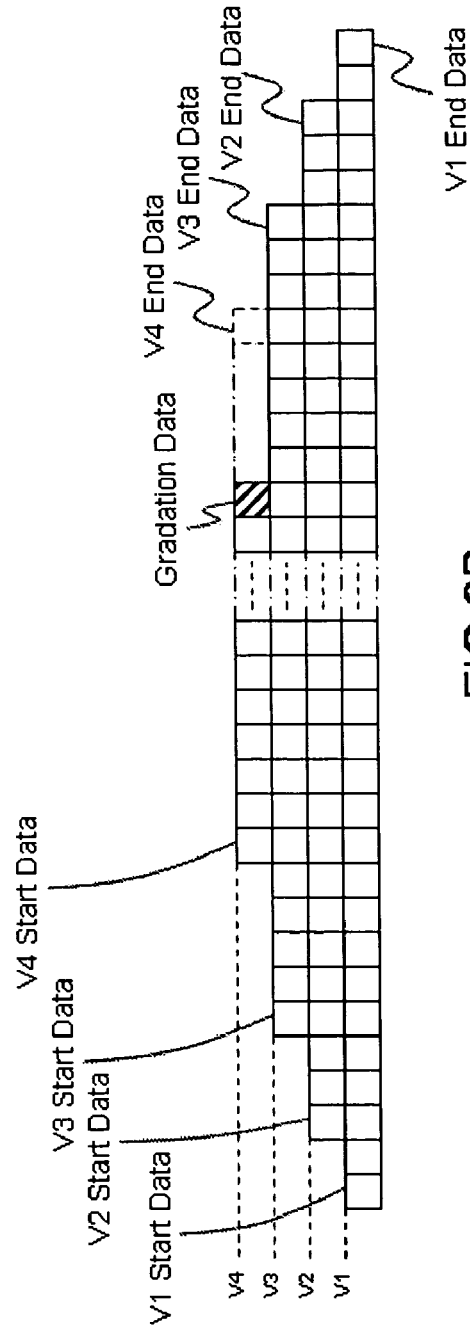

FIGS. 9A and 9B illustrate the driving waveforms in the normal driving and the PWM driving. FIG. 9A shows the waveform that is observed in a case where the PWM driving is selected through the MODE signal. FIG. 9B shows the same waveform as in FIG. 6A (the normal waveform: the new Vn driving waveform).

As shown in FIG. 9A, in the PWM driving, the same operation as in the normal driving is performed until the position of the gradation data (the shaded block in FIG. 9A). On the other hand, beyond the position of the gradation data (the shaded block in FIG. 9A), a time output that is equivalent to the number of steps (two steps in FIG. 9A) is performed at V3, which is one level lower. Next, a time output that is equivalent to the number of steps (two steps in FIG. 9A) is performed at V2. After that, the above procedures are repeated until it reaches the ground (GND) level. Thus, the waveform for the PWM driving is generated.

Meanwhile, various kinds of driving waveform control can be performed using waveform data and gradation data.

Figure 10:
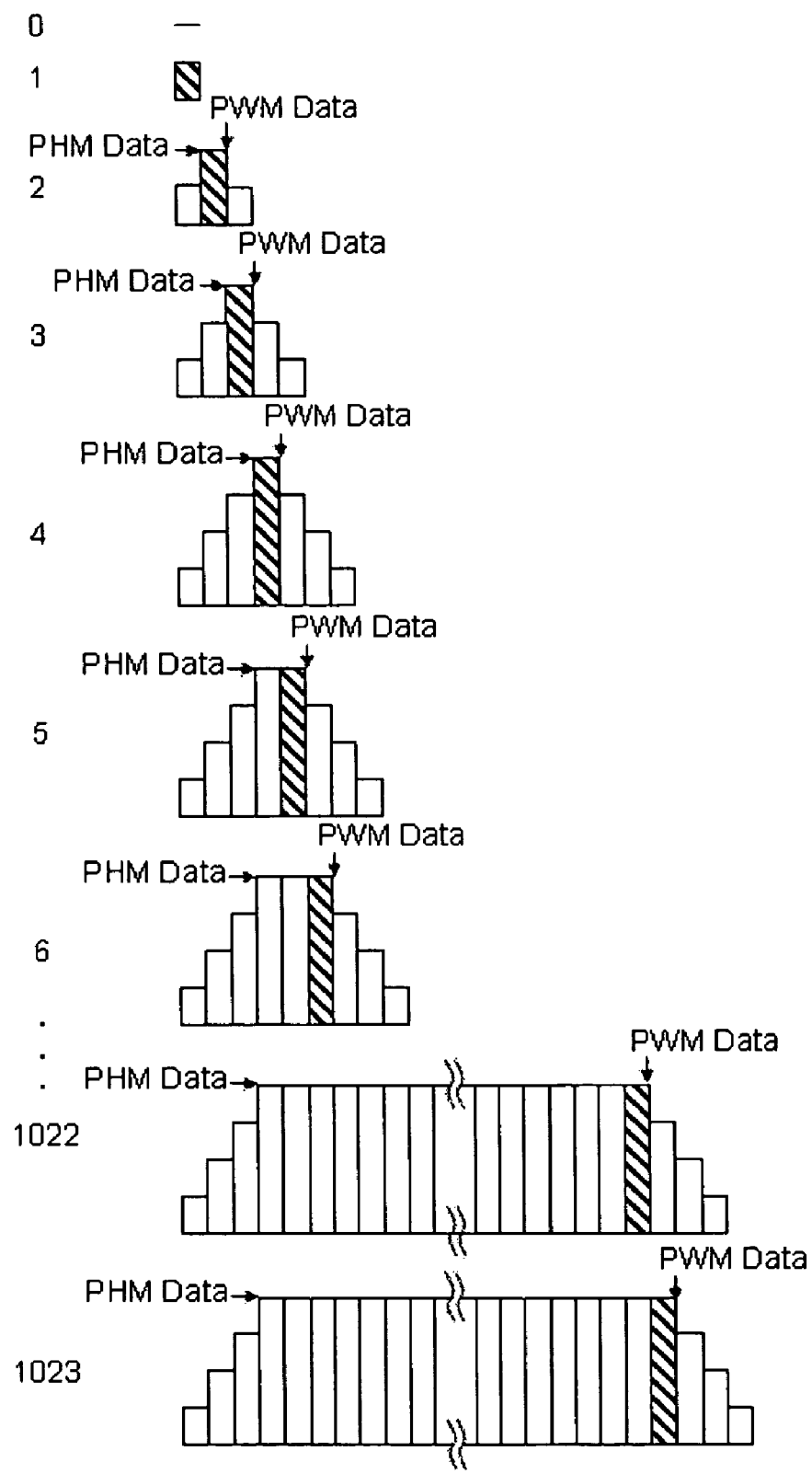
FIG. 10 is a schematic diagram illustrating an example of a PWM driving waveform according to one embodiment of the present invention.
Figure 11:
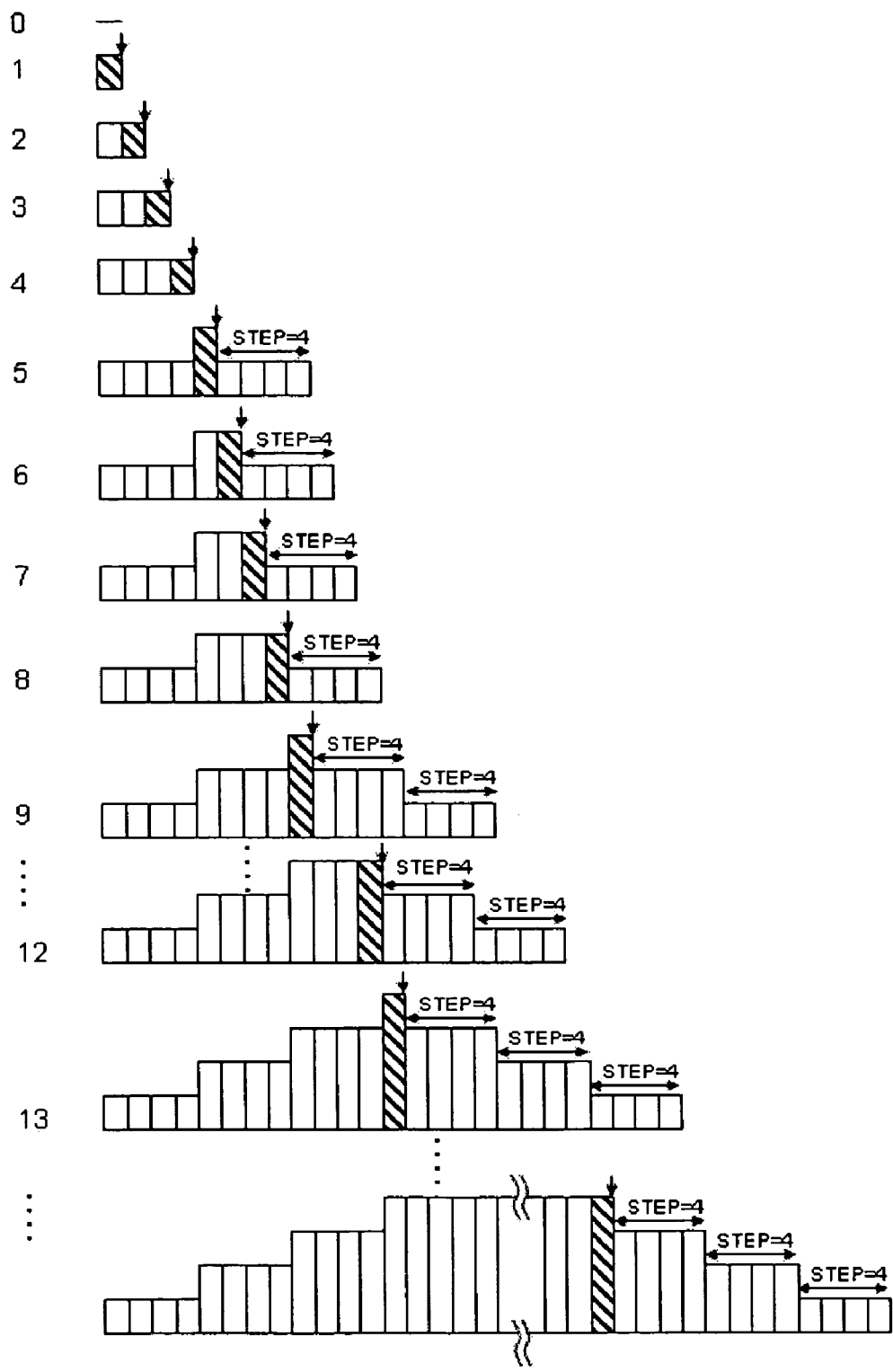
FIG. 11 is a schematic diagram illustrating another example of a PWM driving waveform according to one embodiment of the present invention.
Figure 12:
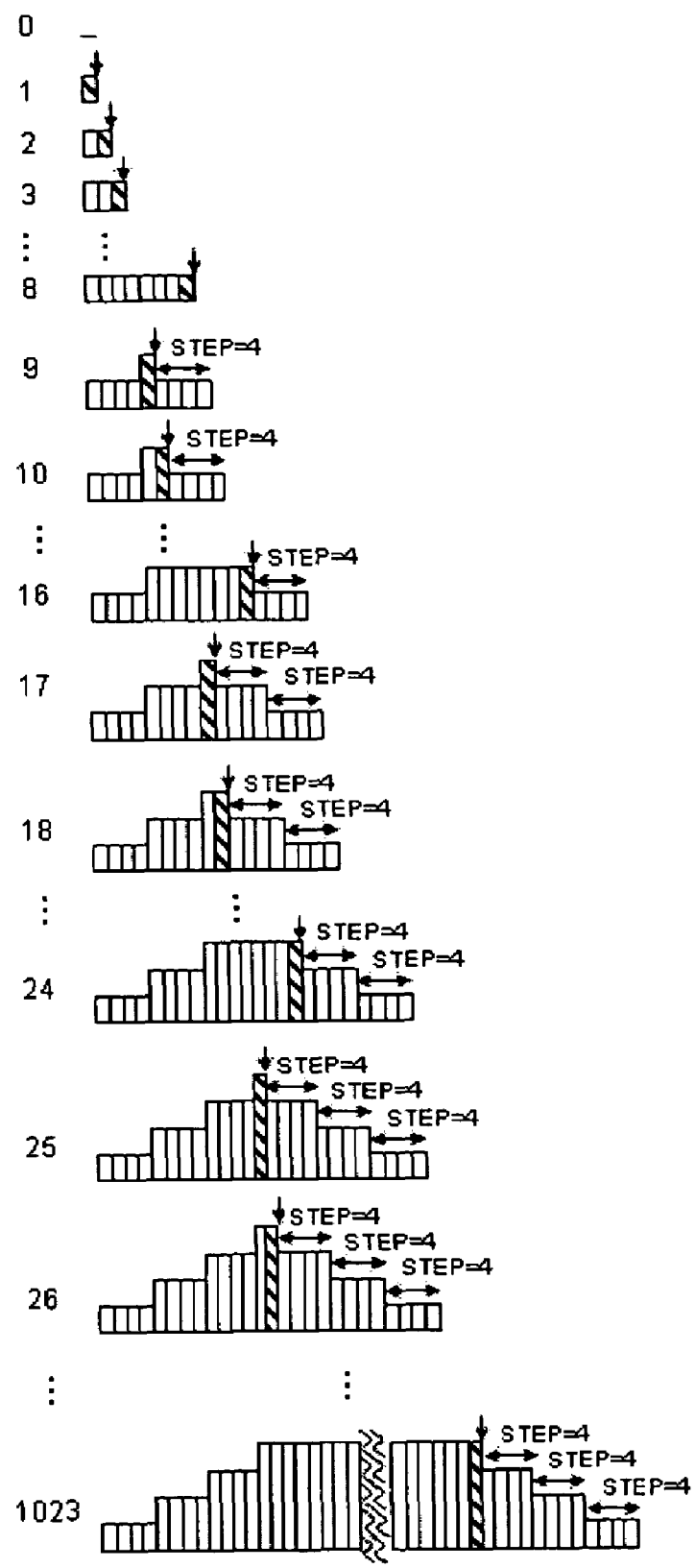
FIG. 12 is a schematic diagram illustrating yet another example of a PWM driving waveform according to one embodiment of the present invention.

Each modulation signal in the operating mode shown in FIG. 9A has the maximum time width that increases simply with an increase in the gradation data. Referring now to FIGS. 10 through 12, this feature of this embodiment will be described in greater detail.

FIG. 10 illustrates an example of a PWM driving waveform. The waveform parameters are set in such a fashion that the number of steps at the time of falling is "1", and each rising portion from V2 to V4 increases by 1 step. In FIG. 10, the PHM data and PWM data as the gradation data are shown by the shaded blocks. With this arrangement, blocks of V1, V2, V3, and V4 are added to the parts of the waveform, except the top end and the rear end during the time the gradation shifts from the in such a manner that the rising portion and the falling portion have step-like shapes. When the gradation is 5 or higher, V4 blocks are placed next to the blocks that are added when the gradation is one level lower. This block adding is repeated until the gradation becomes 1023. When the gradation is 5 or higher, the time output increases as the gradation value increases by 1, and the V4 blocks are added in a linear fashion. In this manner, the waveform for the PWM driving can be formed.

FIG. 11 shows another example of the PWM driving waveform. In this example shown in FIG. 11, the number of steps at the time of falling is "4, and each rising portion from V2 to V4 increases by 4 steps. In FIG. 11, the PHM data and PWM data as the gradation data are shown by the arrows. With this arrangement, a block of potential V1 is added until the gradation becomes 4 or becomes equivalent to the number of falling steps.

In the stage where the gradation is 5, blocks in the same number as the number of steps of the V1 blocks in the previous stage, and blocks of V2 are placed next to the block that is added in the previous stage. As a result, four blocks adjusted to V1 are placed on either side of the blocks adjusted to V2. While the gradation changes from 5 to 8, or while the number of blocks adjusted to V2 increases by the number of steps, the number of rising and falling steps is maintained, and blocks are placed next to the V2 blocks added in the previous stage, as in the stages where the gradation is 1 to 4.

In the case where the gradation is 9, blocks adjusted to V3, blocks adjusted to V1, and blocks adjusted to V2 in the same number as the number of sets of step data are sequentially added next to the blocks added in the previous gradation, so that the number of rises and falls is maintained the same as the number of steps on either side of the portion of the maximum amplitude value. After the gradation becomes 9, blocks adjusted to V3 in the same number as the number of steps are sequentially added in the above-described manner.

In the stage where the gradation is 13, blocks adjusted to V4 are added in the same manner as the above. After the gradation becomes 13, blocks adjusted to V4 are sequentially added next to the blocks added in the previous gradation.

In the above-described manner, the location of the gradation data (the shaded blocks in FIG. 11) is changed in the same manner as in FIG. 10. By doing so, the time output can be increased as the gradation increases, and the waveform for pulse width modulation driving can be formed.

FIG. 12 shows yet another example of the PWM driving waveform. In this example shown in FIG. 12, the number of steps at the time of falling is "4, and each rising portion from V2 to V4 increases by 4 steps, as in the example of the PWM driving waveform shown in FIG. 11. In FIG. 12, a block of V1 is added until the gradation becomes 0 to 8 or becomes equivalent to a value twice the number of steps.

In the case where the gradation is 9, blocks adjusted to V2 are added in such a manner that rising step-like portions and falling step-like portions in the same number as the number of steps are arranged on either side of the blocks to which blocks are to be added. More specifically, blocks adjusted to V2 are added to the center of the set of blocks with the gradation of 8.

Until the gradation becomes 16 or the number of added steps becomes equal to the value twice the number of steps, blocks adjusted to V2 are added next to the blocks added in the previous gradation. In the case where the gradation is 17, blocks adjusted to V3 are added to the center of the set of groups added in the stage where the gradation is 16 as described above. While the gradation is 18 to 24, blocks adjusted to V3 are added next to the blocks added in each previous gradation.

When the gradation becomes 25, blocks adjusted to V4 are added to the center of the set of the blocks added in the stage where the gradation is 24. After the gradation becomes 25, blocks adjusted to V4 are added next to the blocks added in each previous gradation.

As described above, the location of the gradation data (the shaded blocks in FIG. 12) is changed, so that the time output can be increased as the gradation increases. Thus, waveforms for pulse width modulation driving can be formed.

The series of waveforms shown in FIGS. 10, 11, and 12 have the following characteristics. Each of the waveforms includes a first modulation signal corresponding to first gradation data with a predetermined value and a second modulation signal corresponding to second gradation data with a value greater than the predetermined value by 1 (the value of 5 in FIG. 11, and the value of 9 in FIG. 12). The portion to be adjusted to the maximum amplitude value of the waveform of the first modulation signal is adjusted to the amplitude value V1, which is the lowest amplitude value among the amplitude values (V1, V2, V3, and V4) that can be output as amplitude values for the first modulation signal by the modulation circuit. The first modulation signal is the modulation signal corresponding to the gradation data with the value of 4 in FIG. 11, and is the modulation signal corresponding to the gradation data with the value of 8 in FIG. 12. The second modulation signal includes a first portion to be adjusted to the amplitude value V1 and a second portion to be adjusted to the amplitude value V2. The second portion is located in a position other than the top end and the rear end of the waveform of the second modulation signal. The time width of the first portion is equal to or greater than the time width of the portion of the second modulation signal to be adjusted to the amplitude value V1 (equivalent to four unit time widths in FIG. 11, and eight unit time widths in FIG. 12). More specifically, the time width of the first portion is equivalent to eight unit time widths (four unit time widths on either side of the V2 portion) that are counted for setting each time width in FIG. 11. The time width of the first portion is also equivalent to eight unit time widths in FIG. 12. In a case where the modulation signal corresponding to the gradation data with the value greater than the predetermined value by 1 includes a amplitude value portion that is not included in the modulation signal corresponding to the gradation data with the predetermined value, the sum of the time widths of the portions to be adjusted to the respective amplitude values in the waveform of the modulation signals can be certainly increased in the above-described structure.

Next, the differences between the PWM driving waveform shown in FIG. 12 and the PWM driving waveform shown in FIG. 11 are described.

The PWM driving waveform shown in FIG. 11 is designed in such a manner that the timing to start a waveform fall that is designated by the location of the PWM data as gradation data (the shaded blocks in FIG. 11) shifts to a later stage as the gradation increases. On the other hand, the PWM driving waveform shown in FIG. 12 is designed in such a manner that the position of a waveform fall start (shown by the arrows in the drawing) designated by the gradation data (the PWM data) does not uniformly shift to a later stage.

More specifically, in the case where the gradation changes from 4 to 5 in the example shown in FIG. 11, a block of V2 is added, and blocks (equivalent to four steps) of V1 are also added. At other gradation levels, when blocks of higher potentials are to be added, blocks within the range of the number of steps lower than the level of blocks to be added are added. Examples of such cases include the case where the gradation changes from 4 to 5, the case where the gradation changes from 8 to 9, and the case where the gradation changes from 12 to 13 in FIG. 11. In such cases, the luminance varies more widely than in any other case of gradation changes.

In the PWM driving waveform shown in FIG. 12, on the other hand, the same number of blocks as the number of steps are not added to the side to which blocks are to be added, unlike the cases of adding blocks to an upper stage in FIG. 11 (the cases of the gradation 4 to the gradation 5, the gradation 8 to the gradation 9, and the gradation 12 to the gradation 13). Accordingly, the gradation adjustability on the lower gradation side can be further increased.

(Television Apparatus)

Figure 13:
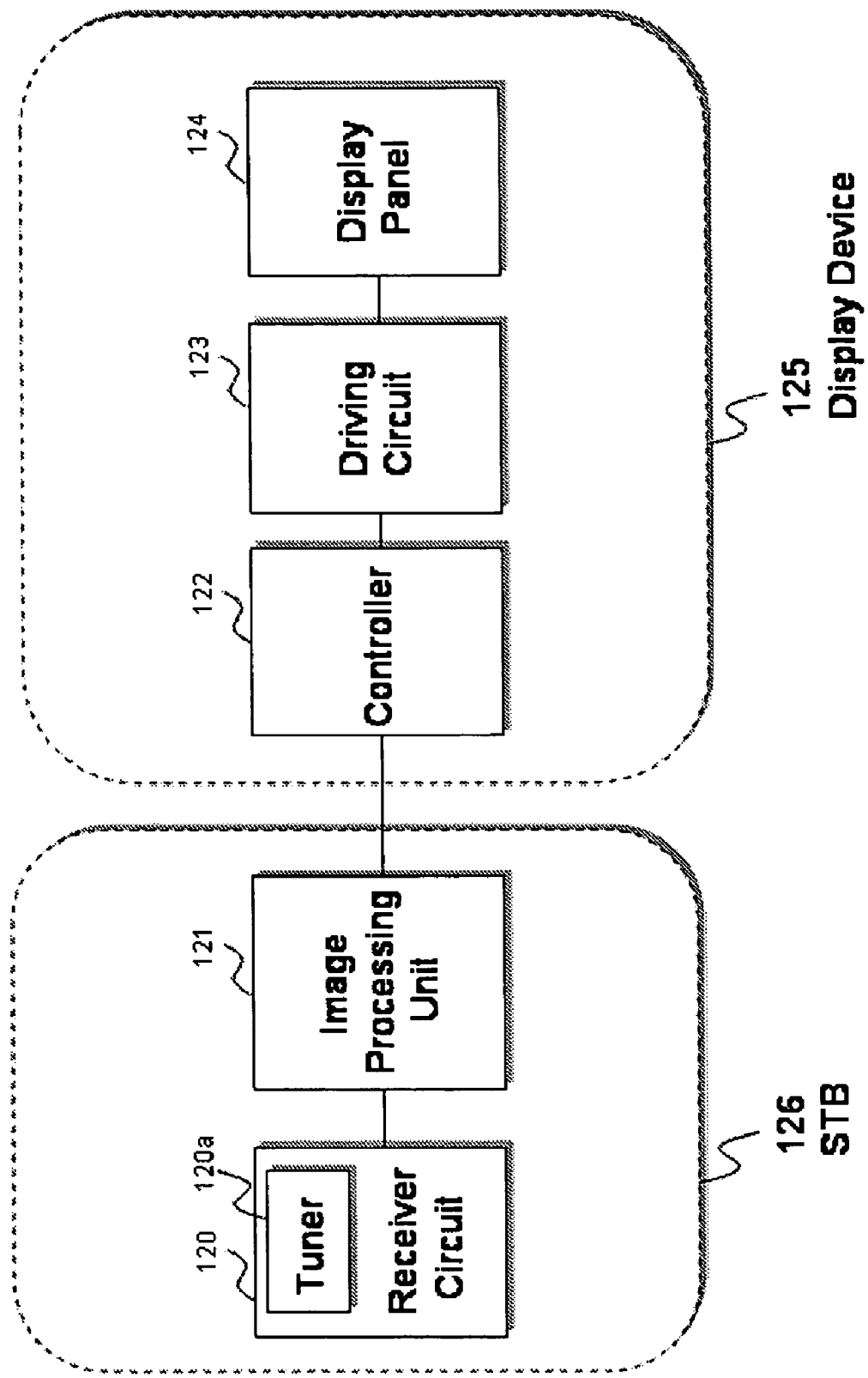
FIG. 13 is a block diagram of a set top box and a television apparatus that employs the driving circuit according to one embodiment of the present invention.

Next, a television apparatus that is equipped with a driving circuit according to the above-described embodiment will be described. FIG. 13 illustrates such a television apparatus equipped with a driving circuit according to the above-described embodiment.

As shown in FIG. 13, the television apparatus includes a receiver circuit 120 equipped with a broadcasting signal tuner 120a, an image processing unit 121, and a display device 125 that includes a controller 122, a driving circuit 123 formed with the above-described driving circuit, and a display panel 124.

The receiver circuit 120 includes the broadcasting signal tuner 120a and a decoder. This receiver circuit 120 receives television signals of satellite broadcasting and terrestrial broadcasting, and broadcasting data via a network. The receiver circuit 120 also outputs decoded video data to the image processing unit 121.

The image processing unit 121 includes a γ-correction circuit, a resolution converting circuit, and an interface (I/F)

circuit. This image processing unit 121 converts the image-processed video data into image data in a predetermined display format suitable for the display device 125. The image data is then output to the display device 125.

The display device 125 includes the display panel 124, the driving circuit 123 formed with a driving circuit according to the above-described embodiment, and the controller 122. The controller 122 performs signal processing, such as a correcting operation that is suitable for the display panel 124, on the input image data. The controller 122 also outputs the image data and various control signals to the driving circuit 123. The driving circuit 123 supplies a driving signal to the display panel 124, based on the input image data. Thus, a television image is displayed on the display panel 124.

The receiver circuit 120 and the image processing unit 121 may be housed as a set top box (STB) 126 in a different case from the display device 125 or in the same case as the display device 125. Further, other various combinations of the above components may be employed.

Although the present invention has been described by way of examples, it is not limited to the above-described embodiments, and various modifications can be made to them based on the technical spirit of the present invention.

For example, each circuit and the numbers of steps described in the above embodiments are merely examples, and different circuit structures and different numbers of steps may be employed as necessary.

This application claims priority from Japanese Patent Application No. 2004-193936 filed Jun. 30, 2004 and No. 2005-175119 filed Jun. 15, 2005, which are hereby incorporated by reference herein.

What is claimed is:

1. A modulation circuit that outputs a modulation signal, said modulation circuit comprising:
   a memory circuit that stores waveform data that determines a time width of a portion having a predetermined amplitude value of the modulation signal in advance; and
   a circuit that generates the modulation signal based on the waveform data and input gradation data,
   wherein the waveform data includes (a) data that determines a timing of start of a control operation to perform a transition from another amplitude value to the predetermined amplitude value, and (b) data to determine a timing of start of a control operation to perform a transition from the predetermined amplitude value to another amplitude value.

2. A modulation circuit according to claim 1, wherein each of a plurality of modulation signals respectively corresponding to a plurality of the gradation data with different values has the portion which is adjusted to the predetermined amplitude value, and wherein the waveform data is referred to in order to determine the time widths of the portions of the modulation signals.

3. A modulation circuit according to claim 1, wherein the gradation data includes data that determines a timing of start of a control operation to make an amplitude value of any one of portions of the modulation signal fall.

4. A modulation circuit according to claim 1, wherein the waveform of the modulation signal has a portion controlled to have a stepped form, and the waveform data includes information that determines the form of the portion controlled to have the stepped form.

5. A driving circuit comprising:
   the modulation circuit according to claim 1; and
   a data output circuit that converts an input signal into the gradation data,
   wherein the modulation circuit and the data output circuit are provided on different substrates from each other.

6. A modulation circuit that outputs a modulation signal, said modulation circuit comprising:
   a memory circuit that stores waveform data that determines a time width of a portion having a predetermined amplitude value of the modulation signal in advance; and
   a circuit that generates the modulation signal based on the waveform data and input gradation data,
   wherein the waveform data includes data that determines the time width of the portion from a timing of start of a control operation to perform a transition from another amplitude value to the predetermined amplitude value, the timing being determined by the gradation data.

7. An image display device comprising:
   the modulation circuit according to claim 6;
   a plurality of scanning wirings;
   a plurality of modulation wirings to which modulation signals are supplied from the modulation circuit; and
   a plurality of display elements that are connected in a matrix fashion with the plurality of scanning wirings and the plurality of modulation wirings.

8. A television apparatus comprising:
   the image display device according to claim 7; and
   a tuner that is capable of selecting television broadcasting signals,
   wherein image display is performed based on signals output from the tuner.

9. A method of generating a modulation signal, said method comprising the steps of:
   inputting gradation data to a modulation circuit, the modulation circuit having a memory circuit that stores waveform data that determines a time width of a portion having a predetermined amplitude value of the modulation signal in advance; and
   generating the modulation signal based on the waveform data and the input gradation data in the modulation circuit,
   wherein the waveform data includes (a) data that determines a timing of start of a control operation to perform a transition from another amplitude value to the predetermined amplitude value, and (b) data to determine a timing of start of a control operation to perform a transition from the predetermined amplitude value to another amplitude value.

10. A modulation circuit configured:
   to generate a first modulation signal corresponding to first gradation data with a predetermined value so that the first modulation signal has a waveform in which an amplitude value of a portion to be adjusted to the maximum amplitude value in the waveform becomes an amplitude value Vk, which is the lowest value among the amplitude values that the modulation circuit can output, and
   to generate a second modulation signal corresponding to second gradation data with a value greater than the predetermined value by 1 so that the second modulation signal has a waveform which includes a first portion to be adjusted to the amplitude value Vk and a second portion to be adjusted to an amplitude value Vk+1 (Vk<Vk+1), the second portion being located in a position other than beginning and end of the waveform of the second modulation signal, the first portion having a time width equal to or greater than a time width of the portion to be adjusted to the amplitude value Vk in the waveform of the first modulation signal.

11. A modulation circuit according to claim 10, configured to generate a modulation signal corresponding to gradation data with a value greater than the value of the second gradation data by N (N>=1) so that the modulation signal has such a waveform that a time width of the second portion to be adjusted to the amplitude value Vk+1 in the waveform of the second modulation signal is increased by N times width of unit time of time width control.

12. An image display device comprising:
the modulation circuit according to claim 10;
a plurality of scanning wirings;
a plurality of modulation wirings to which modulation signals are supplied from the modulation circuit; and
a plurality of display elements that are connected in a matrix fashion with the plurality of scanning wirings and the plurality of modulation wirings.

13. A television apparatus comprising:
the image display device according to claim 12; and
a tuner that is capable of selecting television broadcasting signals,
wherein image display is performed based on signals output from the tuner.

14. A method of outputting a modulation signal, said method comprising the steps of:
outputting a first modulation signal corresponding to first gradation data with a predetermined value, the amplitude value of a portion to be adjusted to the maximum amplitude value of the waveforms of the first modulation signal being adjusted to a amplitude value Vk that is the lowest amplitude value among amplitude values that the modulation circuit can output as the amplitude values of modulation signals; and
outputting a second modulation signal corresponding to second gradation data with a value greater than the predetermined value by 1, and having a first portion to be adjusted to the amplitude value Vk and a second portion to be adjusted to a amplitude value Vk+1 (Vk<Vk+1), the second portion being located in a position other than the front edge and the rear edge of the waveform of the second modulation signal, the time width of the first portion being equal to or greater than the time width of the portion of the first modulation signal to be adjusted to the amplitude value Vk.

15. An image display device comprising:
the modulation circuit according to claim 1;
a plurality of scanning wirings;
a plurality of modulation wirings to which modulation signals are supplied from the modulation circuit; and
a plurality of display elements that are connected in a matrix fashion with the plurality of scanning wirings and the plurality of modulation wirings.

16. A television apparatus comprising:
the image display device according to claim 15; and
a tuner that is capable of selecting television broadcasting signals, wherein
image display is performed based on signals output from the tuner.

17. An apparatus that generates a modulation signal in which an amplitude value and a time width of the amplitude value are controlled in accordance with input gradation data, said apparatus comprising:
a control circuit; and
an output portion,
wherein the control circuit is a control circuit configured to specify a maximum time width which is a maximum value of a time width of a first amplitude value, and
wherein the output portion is an output portion configured:
(a) to output the modulation signal in which the time width of the first amplitude value is controlled so as to be a time width corresponding to the input gradation data which is shorter than or equal to the maximum time width, when the input gradation data is smaller than or equal to a predetermined value; and
(b) to output the modulation signal in which (i) the time width of the first amplitude value is controlled so as to be the maximum time width in a first period and (ii) a time width of a second amplitude value is controlled so as to be a time width corresponding to a difference between the input gradation data and the predetermined value in a second period different from the first period, when the input gradation data is greater than the predetermined value.

18. An image display device comprising:
the apparatus according to claim 17; and
an image display unit having a plurality of display elements.

19. An image display device according to claim 18, wherein the display element has an electron emission element and a fluorescent body which emits light by irradiation of electrons emitted from the electron emission element.

20. A television apparatus comprising:
a tuner for a television broadcasting signal; and
the image display device according to claim 19, which displays an image based on signals output from the tuner.

21. A modulation circuit that outputs a modulation signal, said modulation circuit being configured:
(a) to output the modulation signal in which a time width of a first amplitude value is controlled so as to be a time width corresponding to input gradation data which is shorter than or equal to a predetermined time width as an upper limit, when the input gradation data is smaller than or equal to a predetermined value; and
(b) to output the modulation signal in which (i) the time width of the first amplitude value is controlled so as to be equal to or greater than the predetermined time width in a first period and (ii) a time width of a second amplitude value is controlled so as to be a time width corresponding to a difference between the input gradation data and the predetermined value in a second period different from the first period, when the input gradation data is greater than the predetermined value.

* * * * *